United States Patent [19]

Kawakami et al.

[11] Patent Number: 5,486,756
[45] Date of Patent: Jan. 23, 1996

[54] DC CURRENT SENSOR

[75] Inventors: Makoto Kawakami; Shigeru Yamaguchi, both of Osaka, Japan

[73] Assignee: Sumitomo Special Metals Co., Ltd., Tokyo, Japan

[21] Appl. No.: 402,501

[22] Filed: Mar. 13, 1995

Related U.S. Application Data

[62] Division of Ser. No. 96,159, Jul. 9, 1993, abandoned.

[30] Foreign Application Priority Data

Jul. 10, 1992 [JP] Japan .................. 4-207380
Jul. 10, 1992 [JP] Japan .................. 4-207381
Nov. 5, 1992 [JP] Japan .................. 4-322363
Jan. 26, 1993 [JP] Japan .................. 5-31361

[51] Int. Cl.$^6$ .................. G01R 1/04; G01R 31/00
[52] U.S. Cl. .................. 324/127; 324/117 R; 324/96
[58] Field of Search .................. 324/127, 117 R, 324/96, 142, 253, 221, 220, 262

[56] References Cited

U.S. PATENT DOCUMENTS 3,681,691 9/1970 Mercier .................. 324/96
4,205,266 3/1980 Lichtenberg .................. 324/253
5,204,622 4/1993 McCaslin et al. .................. 324/220

Primary Examiner—Kenneth A. Wieder
Assistant Examiner—Barry C. Bowser
Attorney, Agent, or Firm—Watson Cole Grindle & Watson

[57] ABSTRACT

A DC current sensor with an exciting core of soft magnetic material and formed with a pair of tubular bodies, each tubular body being positioned in parallel with the other to provide therebetween a space, through which passes a wire conducting a current to be detected; a detecting core formed with the side faces of a pair of tubular bodies and two plate-like members of soft magnetic material, each of which connecting integrally with each of the inside edges thereof near an opening of the tubular bodies to form a rectangular frame-shaped member as a whole; exciting coils, each of which magnetically energizing the exciting core in the direction perpendicular to the plane of the detecting core; detecting coils, each of which being wound around the detecting core; and applying an alternating current to the exciting coils to periodically and magnetically saturate the rectangular-shaped portions of the detecting core and exciting core, energizing the exciting coils to modulate a magnetic flux produced in the detecting core corresponding to the DC current flowing through the wire.

6 Claims, 31 Drawing Sheets

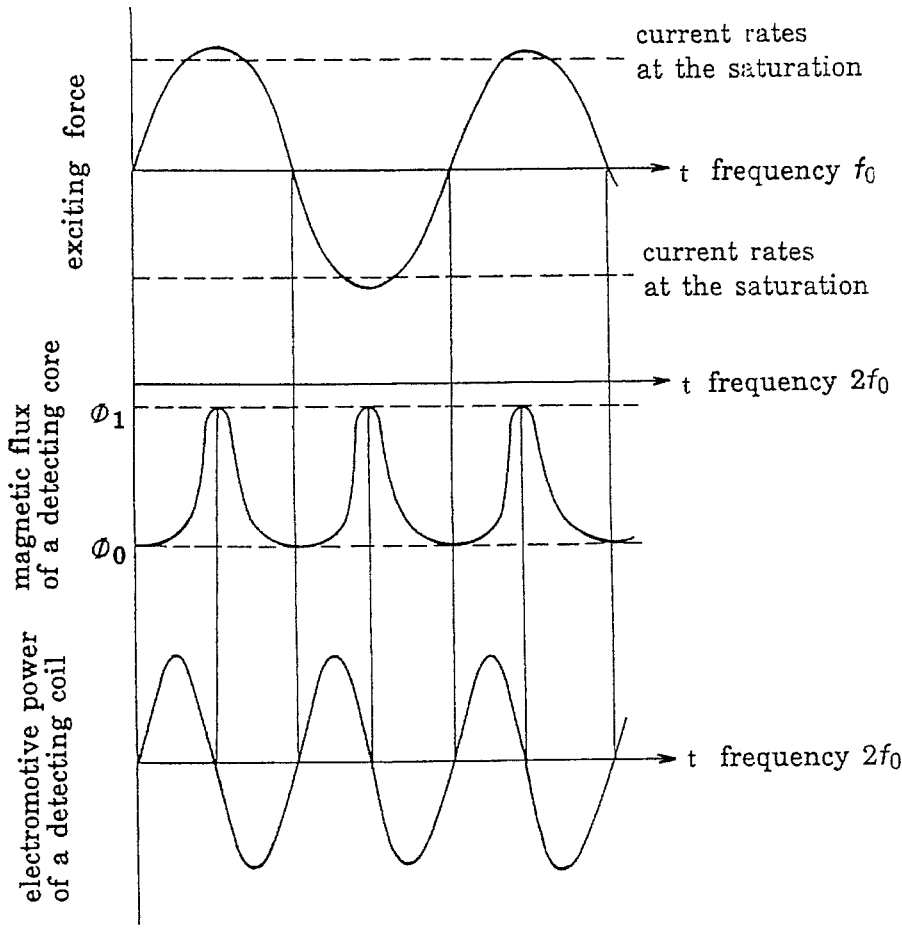

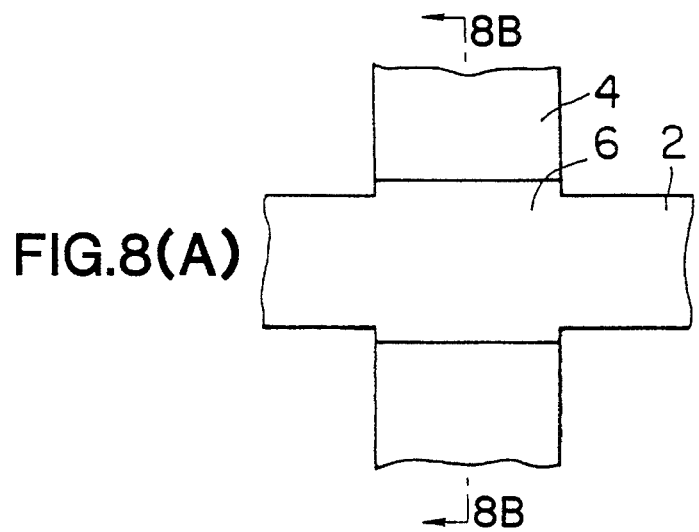
FIG.8(A)
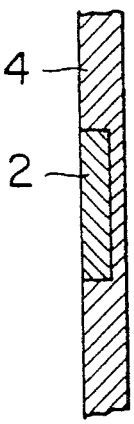
FIG.8(B)
FIG.9

$T_1 - T_2 = 0$ (a) (b) (c)

$T_1 - T_2 > 0 \propto I$ $T_1 - T_2 = 0$ $T_1 - T_2 > 0 \propto I$

DC CURRENT SENSOR

This application is a divisional application of application Ser. No. 08/096,159, filed 9 Jul. 93 now abandoned and is related to application Ser. No. 08/403,116 filed 13 Mar. 95, pending, as a FWC application of application Ser. No. 08/096,159, abandoned.

BACKGROUND OF THE INVENTION

1. Field of the Invention

The present invention relates to a DC current sensor used in a DC leakage breaker and the like, and, particularly, to a sensitive DC current sensor having a relatively simple construction and a good detecting capability for very small current variations.

2. Description of the Prior Art

In recent years, though equipments using a DC current such as electrical appliances incorporating an inverter, electromobiles and the like are increased, requirements on a sensor which detects loads of DC motors built in the various equipments for necessary control, and a DC current sensor used in a DC leakage breaker and the like are enhanced.

As the DC current sensor used in an AC leakage breaker and the like, those applying a current transformer is known widely.

However, this configuration can not be adopted in the leakage breaker used in the aforementioned equipments using the DC current, and hence, conventionally, a shunt resistance method, a magnetic amplifier method, a magnetic multi-vibrator method (Japanese Patent Application Laid Open Nos. Sho 47-1644, Sho 53-31176, Sho 59-46859), a hall device method and the like have been studies.

The shunt resistance method is a method detecting a potential difference generated at opposite end portions of the shunt resistance, by arranging the shunt resistance in a wire being detected in series.

In the magnetic amplifier method and the magnetic multi-vibrator method, a core made of a soft magnetic material consisting of a detecting coil wound in a toroidal shape is used, whereby the wire being detected is extended through the core for DC magnetic deflection of the core made of the soft magnetic material, by the DC current flowing through the wire being detected within a saturated magnetic flux density (Bs), thereby imbalance is produced on a time for alternating magnetic flux generated by applying the AC current to a coil wound on the core in advance, to reach saturation in the positive and negative directions to detect the variation by the detecting coil. Since the magnetic flux variation is given in the core in advance in the magnetic amplifier method, though a configuration of winding an exciting coil on the core to apply the AC current of a predetermined value is adopted, in the magnetic multi-vibrator method, it is so constituted that, the self-oscillation takes place by the operation of a semiconductor and the like in a circuit connected to the detecting coil, and a duty ratio of the oscillation wave form is changed responsive to the electric current being detected for oscillation.

Furthermore, the hall device method is constituted such that, the wire being detected is wound in a toroidal shape directly around the core made of the soft magnetic material, whereon a gap portion for arranging the hall device is formed partially, and the magnetic flux variation in the core in response to the variation in the DC current flowing through the wire being detected is detected.

However, the DC current sensor consisting of the above-mentioned methods are difficult to respond to a very small current variation of the DC leakage breaker and the like by the following reasons, and at present, they are not practically used as the sensitive DC current sensor.

That is, in the shunt resistance method, since the shunt resistance itself is arranged, as an electrical resistance, in a circuit including the wire being detected, an electrical loss in the circuit increases and an electrical effect is bad.

Also, since a detecting circuit for detecting the potential difference produced at opposite ends of the electrical resistance is directly connected to the wire being detected, the detecting circuit and the wire being detected are difficult to be insulated electrically, and for example, the detecting circuit and an applied circuit such as a microcomputer control circuit can not be connected directly, results in a poor versatility.

Besides these disadvantages, though two shunt resistances must be arranged in the circuit of the wire being detected in order to adopt the shunt resistance method in the leakage breaker, it is, in fact, difficult to make characteristics of the shunt resistances uniform, thus a precise measurement of the potential difference can not be realized.

Besides, in order to detect a small leakage by comparing the potential difference measured by the detecting circuit connected to the respective shunt resistances, it is necessary to connect the respective detecting circuits by a very complicated electric circuit, thus it is difficult to provide as the DC current sensor of high practicability.

In the magnetic amplifier method and the magnetic multi-vibrator method, though the detecting circuit and the wire being detected can be insulated electrically, as previously described, the core made of the soft magnetic material must be magnetically deflected by the DC current flowing through the wire being detected, so as to be saturated, substantially near to the saturated magnetic flux density (Bs). When using the known soft magnetic material such a permalloy as the core, for example, when the electric current flowing through the wire being detected is about several tens mA, the wire being detected must be wound around the soft magnetic material core by several tens to several hundreds turns or more, thus, originally, it was difficult to be used as the DC current sensor for the leakage breaker and the like requiring one through turn of the wire being detected.

Also, in the magnetic amplifier method and the magnetic multi-vibrator method, it was difficult to detect a directivity of the DC current flowing through the wire being detected.

Also, in the hall device method, since the detecting capability is inevitably decided by characteristics of the hall device, when the hall device known at present is used, for example, when the electric current flowing through the wire being detected is about several tens mA, the wire being detected must be wound around the soft magnetic material core over several tens to several hundreds turns, thus, similar to the magnetic amplifier method and the magnetic multi-vibrator method, it was difficult to be used as the DC current sensor for the leakage beaker and the like requiring one through turn of the wire being detected.

SUMMARY OF THE INVENTION

It is an object of the present invention to provide a sensitive DC current sensor which solves the aforementioned problems, having a relatively simple configuration and a good detecting capability for a DC leakage breaker and the like, particularly, for a very small current variation.

It is another object of the present invention to provide a sensitive DC current sensor capable of detecting an absolute value of a micro electric current as well as a directivity of the micro electric current.

It is a further object of the present invention to provide a DC current sensor capable of reducing a hysteresis of output characteristics and improving a detecting sensitivity in a ultra-micro electric current region.

It is a still further object of the present invention to provide a DC current sensor, which is very simple to install and arrange on a wire being detected whose wiring is completed already, and can use for various purposes.

The inventors have, taking notice of the fact that, when a wire being detected is extended through a detecting core consisting of an annular soft magnetic material, around which a detecting coil is wound in a toroidal shape, and applying an electric current therethrough, though a clockwise magnetic field is generated against the direction of the DC current and a magnetic flux $\Phi_0$ is produced in the detecting core, since the electric current flowing through the wire being detected is the Dc current the magnetic flux $\Phi_0$ is constant and an electromotive force is not generated in the detecting coil, studied to generate the electromotive force in the detecting coil, by forming a magnetic gap partly in the detecting core, which is open and closed by a magnetic body to constitute a magnetic switch, and changing (ON-OFF) the magnetic flux $\Phi_0$ with time by the magnetic switch.

Furthermore, as the results of various studies to make the above-mentioned configuration more realistic, the inventors have confirmed that this object can be achieved, by disposing means for partly forming magnetic gaps periodically in the detecting core by the magnetic flux generated in a substantially perpendicular direction, against the magnetic flux generated in a circumferential direction in the detecting core by the DC current flowing through the wire being detected, in place of the mechanical magnetic switch, and realizing the operation substantially similar to the aforesaid magnetic switch.

As the means for partly forming the magnetic gaps periodically in the detecting core, a configuration whereby a portion of the detecting core is magnetically saturated, by the magnetic flux generated substantially in a perpendicular direction against the magnetic flux generated in a circumferential direction in the detecting core by the DC current flowing through the wire being detected, to interrupt a magnetic path by the circumferential magnetic flux periodically, or a configuration whereby the magnetic flux is generated substantially in a perpendicular direction against the magnetic flux generated in a circumferential direction in the detecting core by the DC current flowing through the wire being detected, to change the direction of the circumferential magnetic flux by a repulsive action of the magnetic fluxes, and to interrupt the magnetic path by the circumferential magnetic flux periodically, may be adopted.

BRIEF DESCRIPTION OF THE DRAWINGS

FIGS. 2A, 2B, 2C and FIGS. 3A, 3B and 3C are graphs showing the relationship between the frequency of an exciting power applied on an exciting core, a magnetic flux passing through a detecting core and an electromotive force of a detecting coil in a configuration of a DC current sensor of the present invention shown in FIG. 1, wherein (A) shows a displacement with time of an exciting current, (B) shows a displacement with time of a magnetic flux passing through the detecting core, and (C) shows the relationship between the electromotive force of the detecting coil and the displacement with time.

FIG. 8(A) is a partially plan view for explaining an outline of a configuration, which magnetically saturates only core intersection of a detecting core and an exciting core in configuration of a DC current sensor of the present invention shown in FIG. 1, and 8(B) is a sectional view taking along a line B—B in the figure.

FIG. 9 is an explanatory plan view showing an outline of one embodiment of a core material for manufacturing a DC current sensor of the present invention.

DETAILED DESCRIPTION OF THE PREFERRED EMBODIMENTS

A DC current sensor proposed by the present invention is constituted by, as one basic configuration, providing a core intersection which intersects and connects to a potion of a detecting core consisting of an annular soft magnetic material, in a circumferential direction of the detecting core to dispose an exciting core consisting of an annular soft magnetic material in a body, and disposing a detecting coil and an exciting coil wound in a toroidal shape around the cores, and furthermore, extending a wire being detected, through which a DC current for isolate detection is flowing, through the detecting core.

Particularly, in the above-mentioned configuration, AC current applying means to the exciting coil, which excites the exciting core in a perpendicular direction to a circumferential direction of the detecting coil, and magnetically saturates a core intersection, where the exciting core intersects and connects in a circumferential direction of the detecting core, periodically is included, thereby a magnetic flux generated in the detecting core in response to the DC current flowing through the wire being detected at the time of excitation can be modulated, and the DC current flowing through the wire being detected can be detected by an electromotive force having a double frequency of an exciting current outputted from the detecting coil.

In other words, the DC current sensor of the present invention for isolate detection of the DC current flowing through the wire being detected is constituted such that, the detecting coil is wound in a toroidal shape around the detecting core consisting of an annular soft magnetic material through which the wire being detected is extended, the exciting core consisting of the annular soft magnetic material and connected perpendicularly to a portion of the detecting core in the circumferential direction of the detecting core is disposed in a body, and the exciting coil is wound in a toroidal shape around the exciting core, by exciting the exciting core perpendicularly in a circumferential direction of the detecting core by applying the AC current to the exciting coil, and magnetically saturating the core intersection of the detecting core and the exciting core periodically, a magnetic flux generated in the detecting core in response to the DC current flowing through the wire being detected is modulated, and by optating the electromotive force having a double frequency of the exciting current from the detecting coil, the DC current flowing through the wire being detected is detected.

The DC current sensor of the present invention thus constructed is particularly described with reference to FIG. 1, FIG. 2 and FIG. 3.

Figure 1A:
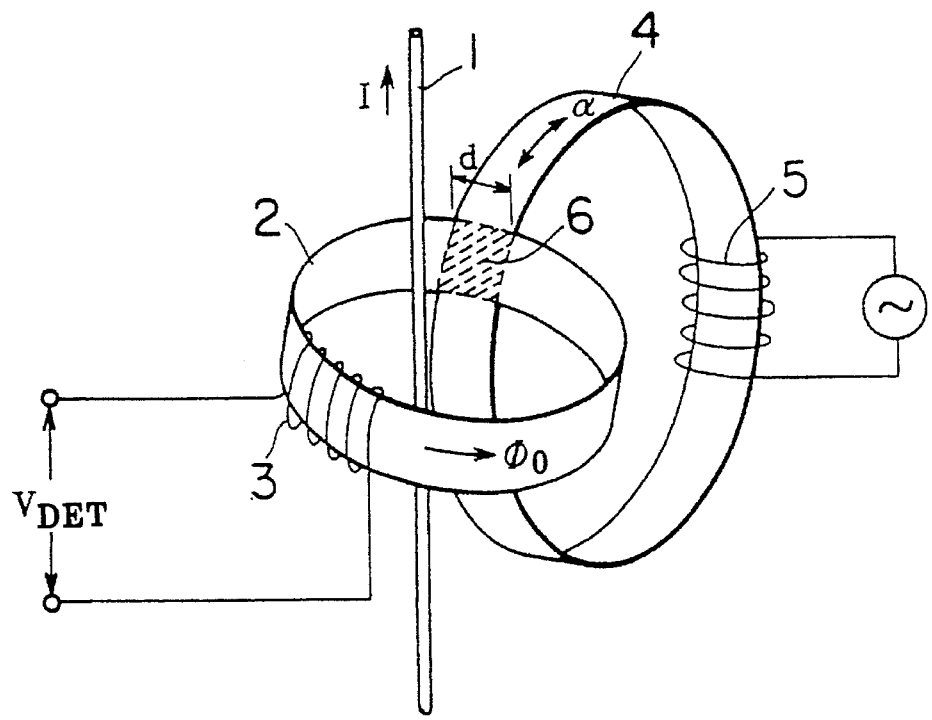
FIG. 1(A) is a perspective explanatory view showing a basic construction of a DC current sensor of the present invention.
Figure 1B:
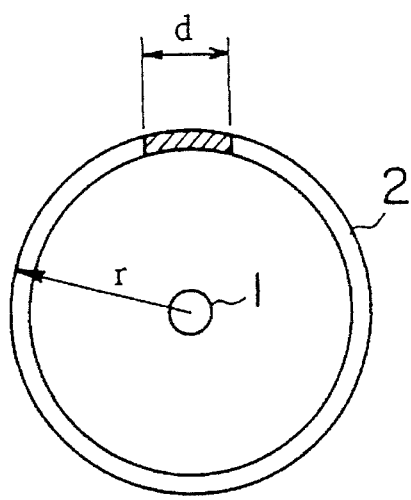
FIG. 1(B) is its partly sectional explanatory view.

FIG. 1(A) is a perspective explanatory view showing an outline of one embodiment of the DC current sensor of the present invention, and FIG. 1(B) is a partially sectional explanatory view thereof. FIG. 2 and FIG. 3 show the relationship between an exciting current, a magnetic flux passing the detecting core and an electromotive force generated in the detecting core in this configuration.

In FIG. 1, numeral I designates a wire being detected extending through a detecting core 2 consisting of an annular soft magnetic material. Numeral 3 designates a detecting coil which is wound in a toroidal shape around a predetermined position of the detecting core 2, and is connected to a predetermined detecting circuit (not shown) while securing electrical insulation against the wire 1 being detected.

Numeral 4 designates an exciting core consisting of an annular soft magnetic material, whereon an exciting coil 5 wound in a toroidal shape is disposed at a predetermined location. Besides, the exciting core 4 is constituted so as to connect perpendicularly to a circumferential portion of the detecting core 2 in a circumferential direction thereof, and by the operation to be described later, forms an magnetically saturated portion at a portion shown by oblique lines, or a core intersection 6 of the detecting core 2 and the exciting core 4.

In the configuration shown in FIG. 1, when a DC current I flows through the wire 1 being detected, a magnetic field is generated clockwise to the direction of the DC current I in the detecting core 2, and a magnetic flux $\Phi_0$ is generated in the detecting core.

At this time, when a predetermined AC current is applied to the exciting coil 5 to generate the magnetic flux, which changes periodically in a direction ∝ in the figure in the exciting core 4, and to magnetically saturate the exciting core 4 periodically, a specific magnetic permeability μ∝ of the core intersection 6 (shown by the oblique lines in the figure), which is a circumferential portion of the detecting core 2, is decreased to form a so-called substantially magnetic gap close to 1, and to reduce the magnetic flux $\Phi_0$ in the detecting core to $\Phi_1$.

Hereupon, when the AC current applied to the exciting coil 5 has a frequency $f_0$, and the exciting core 4 is saturated near a peak value of the electric current, in case the DC current I flowing through the wire 1 being detected is directed to plus (+) (upward in the figure) as shown in FIG. 2, as the case where the DC current I flowing through the wire 1 being detected is directed to minus (−) (downward in the figure) as shown in FIG. 3, the exciting core 4 is saturated for two times by one period of exciting current.

Figures 2A, 2B, 2C:
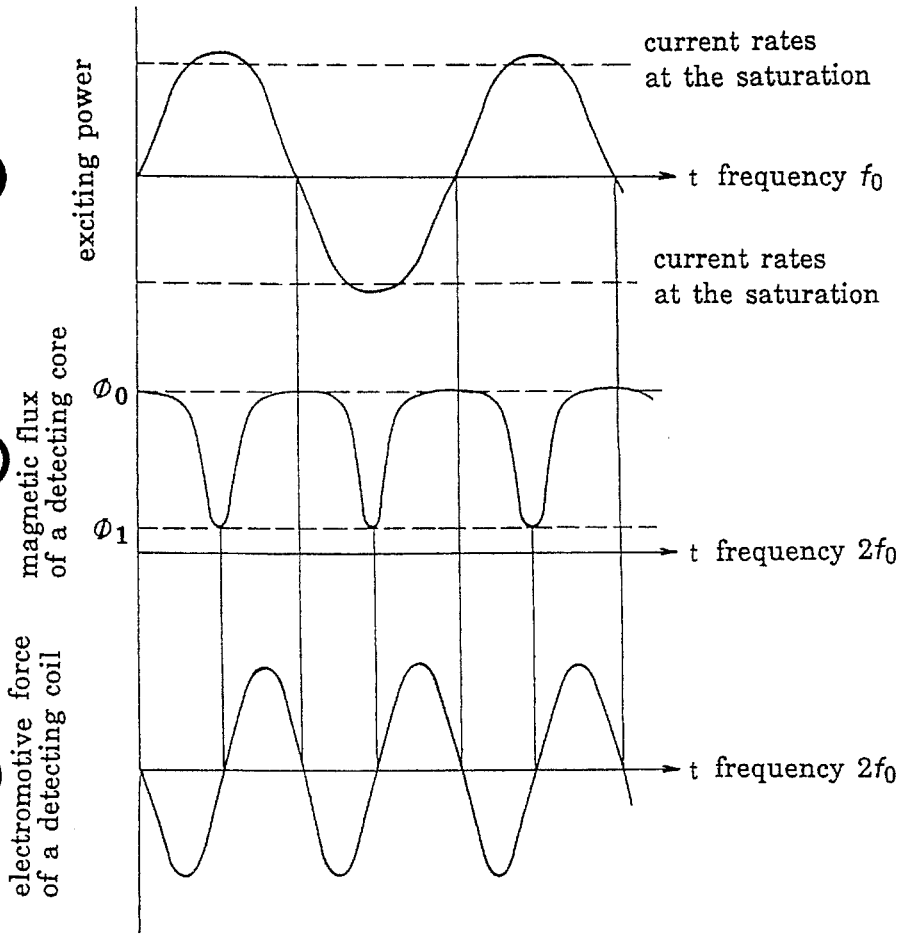

In case the DC current I flowing through the wire 1 being detected is directed to plus (+) (upward in the figure) as shown in FIG. 2, the magnetic flux $\Phi_0$ generated by the DC current I flowing through the wire 1 being detected generated in the detecting core 2 by the saturation, is decreased to $\Phi_1$ at the frequency $2f_0$ as shown in FIG. 2(B). That is, modulated at $2f_0$ is generated in the detecting coil 3 following the change in the magnetic flux as shown in FIG. 2(C).

Also, in case the DC current I flowing through the wire 1 being detected is directed to minus (−) (downward in the figure) as shown in FIG. 3, though the operation is substantially similar to the case where the DC current I is directed to plus (+) (upward in the figure), since the DC current I is in the opposite direction, the magnetic flux generated in the detecting core 2 is also directed oppositely, thereby phases of the voltage $V_{DET}$ of the frequency $2f_0$ generated in the detecting coil 3 respectively differ by 180°.

However, irrespective of the direction of the DC current I flowing through the wire 1 being detected, in any cases, from the relationship of magnetic flux $\Phi_0 \propto$ DC current I and voltage $V_{DET} \propto$ magnetic flux $\Phi_0$, voltage $V_{DET} \propto$ DC current I, and an electromotive force proportional to the DC current I flowing through the wire 1 being detected can be detected by the detecting coil 3, and an absolute value of the DC current I flowing through the wire 1 being detected can be known.

Meanwhile, from the fact that the detecting core 2 and the exciting core 4 are interconnected perpendicularly, basically the exciting magnetic flux in the exciting core 4 does not leak to the detecting core 2 side, and does not pass the detecting core 3, accordingly, the electromotive force by the exciting current applied to the exciting coil 5 is not generated in the detecting coil 3, and when the DC current I flowing through the wire 1 being detected is zero, $V_{DET}=0$.

Also, from the fact that the frequency of the electromotive force $V_{DET}$ generated in the detecting coil 3 is $2f_0$, and differs from the frequency $f_0$ of the exciting current applied to the exciting coil 5, even when the exciting magnetic flux in the exciting core 4 leaks due to accuracy of the shape and size of the detecting coil 2 and the exciting core 4, and is detected by the detecting coil 3, since the frequency of the leakage component is $f_0$, it can be separated easily by a frequency discriminating filter and the like, so that it can be used as the sensitive DC current sensor.

Furthermore, the inventors have studies miniaturization of the DC current sensor shown in FIG. 1, and propose the DC current sensor constituted such that, only the intersection of the detecting core 2 and the exciting core 4 is magnetically saturated, and the exciting core 4 portion besides the intersection is not saturated magnetically.

Figure 4:
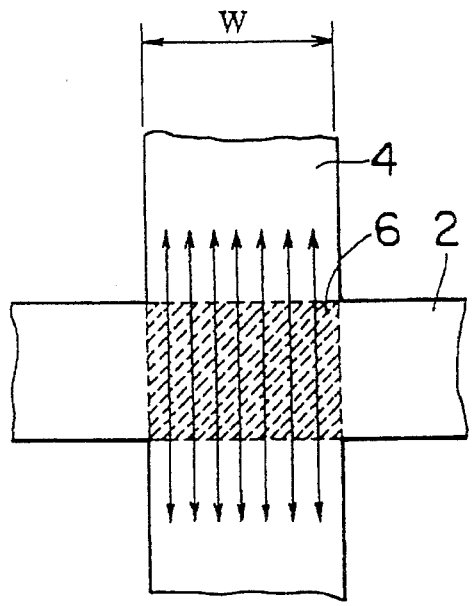
FIG. 4 is a partially detailed view for explaining an outline of a configuration, which magnetically saturates only a core intersection of a detecting core and an exciting core, in a configuration of a DC current sensor of the present invention shown in FIG. 1.

That is, when a width W of the exciting core 4 is made constant as shown in FIG. 4, in order to magnetically saturate the intersection of the detecting core 2 and the exciting core 4, or a portion 6 shown by oblique lines, the entire exciting core 4 must be saturated, as a result, the exciting core becomes larger and a large exciting circuit is required, and there is a possibility of heating by a core loss of the exciting core 4, and causing a temperature drift of the output in the detecting core 3. Arrows in the figure schematically indicate a distribution state of the magnetic flux.

Now, the inventors also propose a configuration, whereby only the core intersection 6 of the detecting core 2 and the exciting core 4 is magnetically saturated by various configurations as shown in FIG. 5 to FIG. 8.

Figure 5:
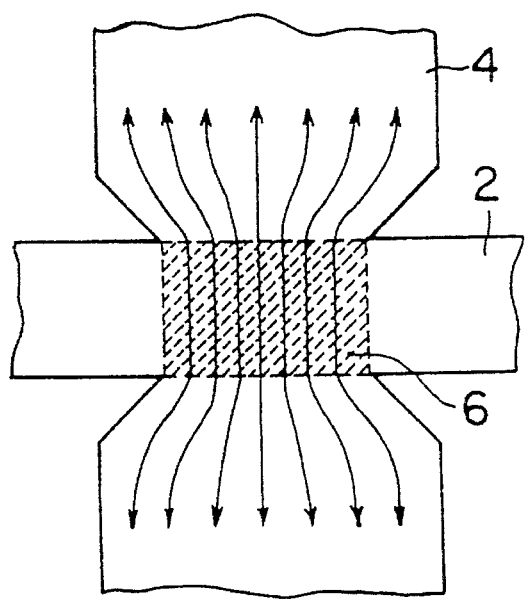
FIG. 5 is a partially detailed view for explaining an outline of a configuration, in which a core intersection of an exciting core is narrowed to magnetically saturate only the intersection of a detecting core and the exciting core, in a configuration of a DC current sensor of the present invention shown in FIG. 1.

The configuration of FIG. 5 is that, only the core intersection 6 shown by the oblique lines in the figure is magnetically saturated and the other portion is not saturated, by narrowing the plate width of a connection with the detecting core 2 on the exciting core 4 side, and minimizing a section area of the connection.

Arrows in the figure schematically show a distribution state of the magnetic flux as same as FIG. 4. Though the core intersection 6 has a large magnetic flux density and is magnetically saturated as same as the case of FIG. 4, in other portions, the magnetic flux density is small and is not saturated.

Figure 6:
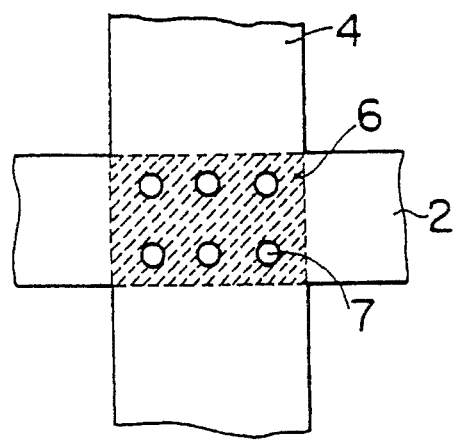
FIG. 6 is a partially detailed view for explaining an outline of a configuration, in which a hole is provided in a core intersection to magnetically saturate only the core intersection of a detecting core and an exciting core, in a configuration of a DC current sensor of the present invention shown in FIG. 1.

The configuration of FIG. 6 is that, a plurality of through holes 7 having a predetermined inside diameter are provided in the core intersection 6 shown by the oblique lines in the figure, and section areas in the perpendicular direction to the circumferential direction of the core intersection 6 are partially narrowed to obtain the substantially same effect as the configuration of FIG. 5.

Figure 7A:
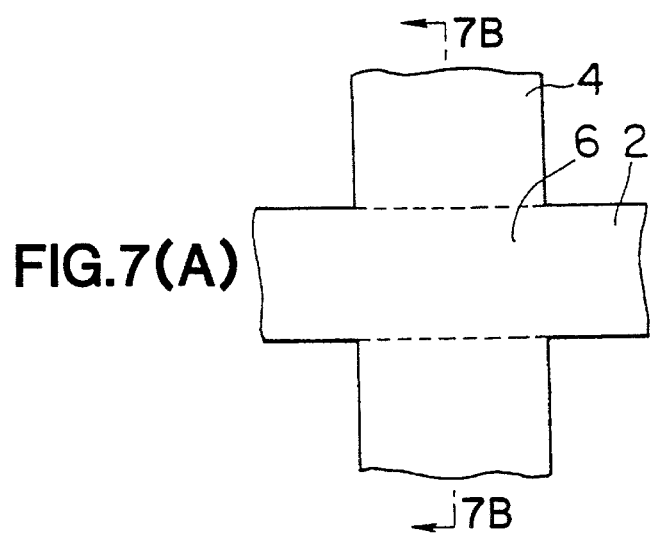
FIG. 7(A) is a partially plan view for explaining an outline of a configuration, which magnetically saturates only a core intersection of a detecting core and an exciting core in a configuration of a DC current sensor of the present invention shown in FIG. 1, and 7(B) is a sectional view taken along a line B—B in the figure.
Figure 7B:
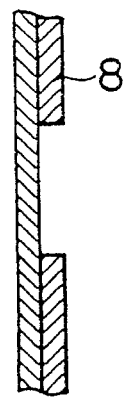

The substantially same effect as the configuration of FIG. 5 can be obtained by the configuration shown in FIGS. 7(A) (B), by securing an annular soft magnetic material inside the exciting core 4 except the core intersection 6 to change the thickness of the exciting core 4.

It is an object of the configuration shown in FIGS. 8(A), (B) to obtain the substantially same effect as those shown in FIG. 5, by changing materials of the detecting core 2 and the exciting core 4, wherein a sensor is constituted by obtaining a cross type core material as shown in FIG. 9 by functioning a clad material, which is prepared by pressing a material (the detecting core 2 side) having a relatively low saturation magnetic flux density Bs, onto a center of a thin plate material (the exciting core 4 side) having a high saturation magnetic flux density Bs in a stripe shape in a body, and connecting respective end portions. The same effect can also be obtained by partially pressing the material having the saturation magnetic flux density Bs lower than other portions, onto only the intersection of the detecting core 2 and the exciting core 4.

In any configuration shown above, by magnetically saturating only the core intersection 6 of the detecting core 2 and the exciting core 4 without saturating the other portions of the exciting core 4, a core loss of the unsaturated portion can be reduced.

Thus, in the configurations shown in FIG. 5 to FIG. 8, as compared with the configuration shown in FIG. 4, an exciting current applied to the exciting coil 5 can be decreased and the exciting circuit is simplified, achieving the miniaturization.

That is, power consumption can be decreased as an entire sensor and an applicable range in the small appliances is widen. Also, since the temperature rise in the exciting core 4 is low, changes in magnetic characteristics of the soft magnetic material constituting the exciting core 4 are small, and a temperature drift of an output in the detecting coil 3 can be reduced, thus stability of a detecting accuracy as the sensor is improved.

The present invention further proposes an improved DC current sensor.

As a result of studies made on the DC current sensor having the above-mentioned configuration to enable detection of a micro electric current, it has been confirmed to enable detection of a micro electric current, it has been confirmed that, even when using permalloy C (78% Ni-5Mo-4Cu-balFe) known as a high magnetic permeability material as the detecting core 2, in a micro current region below about ±50 mA of the DC current flowing through the wire 1 being detected, even in the same current value at the time of increase and decrease of the DC current, a so-called hysteresis phenomenon, where the output voltage (electromotive force) in the detecting coil differs, is produced, and particularly, in the vicinity of zero (±20 mA) of the DC current, a so-called "inversion region", where the output voltage degreases as the DC current increases, is produced.

By the occurrence of the "inversion region", a reference level at the time of measurement fluctuates, and at the measurement in the micro current region, measurement values differ at each time and the accurate value can not be obtained.

It is believed that the occurrence of the "inversion region" is due to a coercive force of the soft magnetic material constituting the detecting core 2, and though a radius γ refer to FIG. 1(B) of the detecting core 2 must be shortened to reduce this influence, the outside diameter and the number of wires being detected are restricted, which is not desirable.

The inventor has repeated further improvements on the DC current sensor having the above-mentioned configuration, whereby, particularly, a width d (refer to FIG. 1(B)) of a connection of the exciting core 4 connected to the detecting core 2 is widened to increase a ratio of the width of the connection of the exciting core 4 relative to a magnetic path length of the detecting core 2, and reduce a residual magnetic flux density of the exciting core 4 by the inverse magnetic field effect, and further, the exciting coil 5 generating the magnetic flux of a predetermined direction in the exciting core 4, is wound circumferentially around the detecting coil 2 to give a demagnetization effect to the detecting core 2 by the exciting coil 5, thereby the DC current sensor capable of reducing the occurrence of the "inverse region" considerably can be proposed.

That is, the present invention is directed to the DC current sensor having the configuration, in which a core intersection, which intersects and connects in a circumferential direction of the detecting core, is provided at a portion of the detecting core consisting of an annular soft magnetic material, to dispose the exciting core consisting of the annular soft magnetic material in a body, and the detecting coil is wound around the detecting core in a toroidal shape, and the exciting coil wound in a circumferential direction of the detecting core is wound around the detecting core, furthermore, a wire being detected, through which the DC current for isolate detection is flowing, is extended through the detecting core.

Particularly, in the above-mentioned configuration, AC current applying means to the exciting coil, which excites the exciting core perpendicularly in a circumferential direction of the detecting core, and magnetically saturates the core intersection where the exciting core intersects and connects in a circumferential direction of the detecting core periodically is included, thereby the magnetic flux generated in the detecting core in response to the DC current flowing through the wire being detected at the time of excitation can be modulated, and an electromotive force having a double frequency of the exciting current is outputted by the detecting coil to detect the DC current flowing through the wire being detected.

In other words, the Dc current sensor of the present invention for isolate detection of the DC current flowing through the wire being detected is constituted such that, the detecting coil is wound in a toroidal shape around the detecting core consisting of the annular soft magnetic material through which the wire being detected is extended, the exciting core consisting of the annular soft magnetic material connected perpendicularly in a circumferential of the detecting core, is disposed in a body at a portion of the detecting core, the exciting wound in the circumferential direction of the detecting core is wound around the detecting core to constitute the DC current sensor, the AC current is applied to the exciting coil to excite the exciting core perpendicularly to the circumferential direction of the detecting core, by magnetically saturating the core intersection of the detecting core and the exciting core periodically, a magnetic flux generated in the detecting core in response to the DC current flowing through the wire being detected is modulated, and by outputting the electromotive force having a double frequency of the exciting current from the detecting coil the DC current flowing through the wire being detected is detected.

Figure 10:
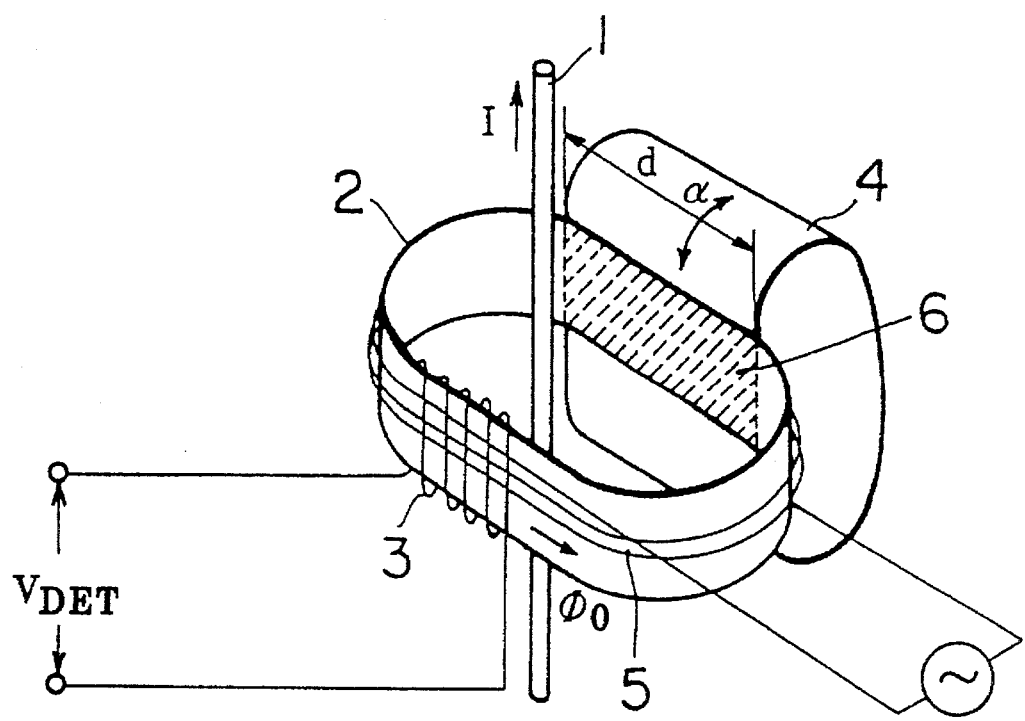
FIG. 10 is an explanatory perspective view showing another basic construction of a DC current sensor of the present invention.

The DC current sensor of the present invention having the above-mentioned configuration is particularly described by FIG. 10.

FIG. 10 is a perspective explanatory view showing an outline of a DC current sensor consisting of another basic configuration of the present invention.

In FIG. 10, numeral 1 designates a wire being detected, which is extended through a detecting core 2 consisting of a substantially elliptical annular soft magnetic material. Numeral 3 designates a detecting coil which is wound around the detecting core 2 in a toroidal shape. Numeral 4 designates an exciting core consisting of a soft magnetic material, connected perpendicularly to a circumferential direction of the directing core 2 to form a substantially elliptical annular shape and disposed in a body at a portion of the detecting coil.

In this configuration, by widening a width d of a connection of the exciting core 4 connected to the detecting core 2, a ratio of the width d of a core intersection 6 of the exciting core 4 against a magnetic path length of the detecting core 2 is made larger than the configuration shown in FIG. 1.

In the configuration shown in FIG. 1, though the exciting coil 5 is wound around the exciting core 4 in a toroidal shape, in this configuration, as shown in the figure, the exciting coil 5 is wound around the detecting core in a circumferential direction thereof.

In such a configuration, when a DC current I flows through the wire 1 being detected, a magnetic field is generated in the detecting core 2 clockwise to the direction of the DC current I, and the magnetic flux $\Phi_0$ is generated in the detecting core 2.

At this time, when a predetermined AC current is applied to the exciting coil 5 to generate a magnetic flux, changing in a direction ∝ in the figure, periodically, in the exciting core 4, and to magnetically saturate the exciting core 4 periodically, the core intersection 6 of a portion shown by oblique lines in the figure, which is a circumferential portion of the detecting core 2, forms a so-called, substantially, magnetic gap, where a specific magnetic permeability μ is very close to 1, and the magnetic flux $\Phi_0$ in the detecting core decreases to $\Phi_1$.

Hereupon, when the AC current applied to the exciting coil 5 has a frequency $f_0$ and the exciting core 4 is saturated near a peak value of the electric current, a voltage $V_{DET}$ having a frequency $2f_0$ is generated in the detecting coil 3, by the same mechanism as the electromotive force generating mechanism in the detecting coil 3 of the DC current sensor consisting of the configuration of FIG. 1 previously described.

Furthermore, since a ratio of the width d of the core intersection 6 of the exciting core 4 against a magnetic path length of the detecting core 2 is made larger, by widening the width d of the core intersection 6 of the exciting core 4 connected to the detecting core 2 as mentioned before, the magnetic gap ratio becomes larger and the residual magnetic flux density in the detecting core 2 is minimized by the inverse magnetic field effect, besides, by the demagnetization effect of the exciting coil wound around the detecting core 2, the occurrence of the "inverse region" can be considerably reduced.

By further improvement of the basic configuration of the present invention shown in FIG. 1 and FIG. 10, electrical imbalances can be reduced, the occurrence of noises is decreased and an S/N ratio can be improved.

Particularly, the other embodiments of the present invention shown in FIG. 11, FIG. 13, FIG. 14, FIG. 18 and FIG. 19 include the above-mentioned effects and the effective configuration capable of realizing a stable measurement.

That is, in the basic configuration of the present invention shown in FIG. 1 and FIG. 10, since one exciting core 4 is connected to the detecting core 2, or the position of detecting coil 3 is one, though the DC current sensor is difficult to be electromagnetically balanced, the configuration considering the electromagnetically balanced arrangement of the exciting core 4 and the detecting core 3 is described in FIG. 11 to FIG. 19.

Figure 11:
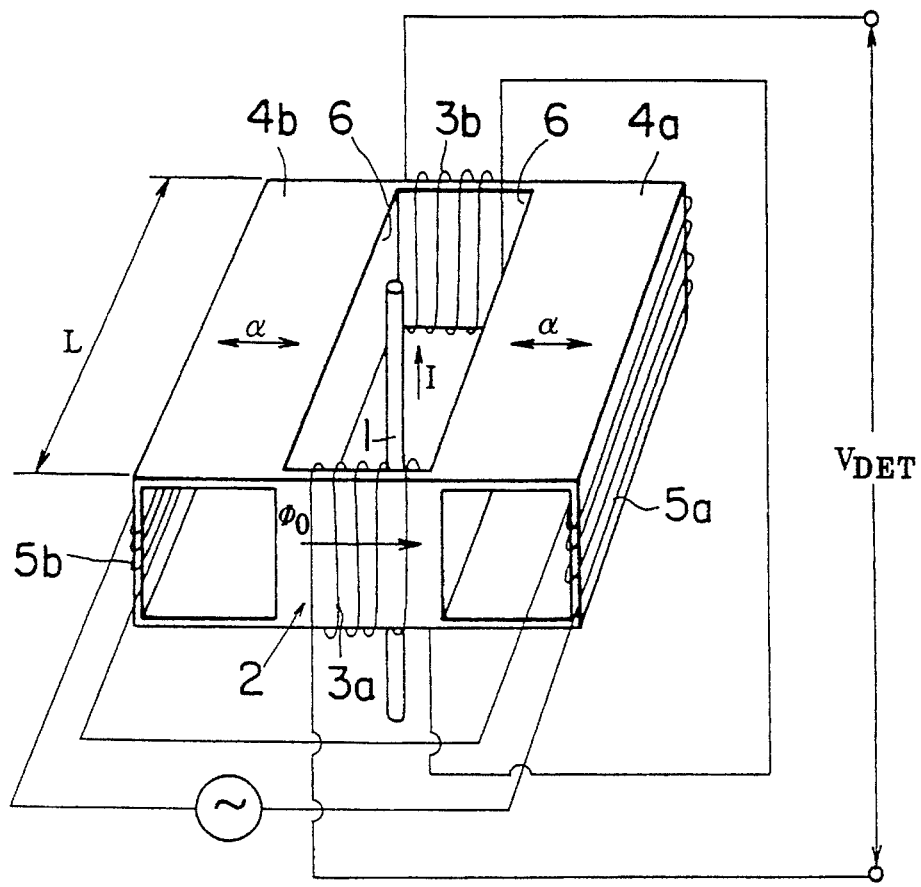
FIG. 11 is an explanatory perspective view showing another embodiment of a DC current sensor of the present invention.

In FIG. 11, numeral 1 designates a wire being detected, which extends through an inner center portion of a rectangular frame-shaped detecting core 2. A pair of detecting coils 3a, 3b are wound in a toroidal shape around the opposite short sides of rectangular frame-shaped detecting core 2, and are electrically connected with each other. On the opposite long sides, a pair of exciting cores 4a, 4b are disposed in a body so as to form a quadrangular tube shape. Moreover, exciting coils 5a, 5b are wound in a toroidal shape around side faces of the outermost periphery of the pair of exciting cores 4a, 4b.

In other words, it is constituted such that, a pair of quadrangular tube bodies serving as the exciting cores 4a, 4b, are arranged in parallel to a center axis line, adjoining side portions of respective opening ends of the quadrangular tube bodies are connected in a body by a connecting plate consisting of a soft magnetic material, to form the rectangular frame-shaped detecting core 2, by the connecting plate and the side faces of the quadrangular tube bodies connected thereto, or the core intersection 6 wherein the detecting coils 3a, 3b are wound respectively around the connecting plate portion in a toroidal shape, and the exciting coils 5a, 5b are wound around the side faces of the outermost periphery of the pair of exciting cores 4a, 4b in a toroidal shape.

When the Dc current I is applied to the wire 1 being detected in such a configuration, magnetic field clockwise to the direction of the DC current I is generated in the detecting core 2 to generate a magnetic flux $\Phi_0$ therein at this time, when a predetermined AC current is applied to the exciting coils 5a, 5b to generate the magnetic flux which changes periodically in a direction ∝ in the figure in a pair of exciting cores 4a, 4b, and to magnetically saturate the exciting cores 4a, 4b periodically, the core intersection 6 of the long side portion which is a circumferential portion of the rectangular frame-shaped detecting core 2 becomes a so-called, substantially, magnetic gap where a specific magnetic permeability μ is very close to 1, thereby the magnetic flux $\Phi_0$ in the detecting core reduces to $\Phi_1$.

Thus, also the DC current sensor of the present invention mentioned above, has the electromotive force generating mechanism to the pair of detecting coils 3a, 3b, which is constituted as same as those shown in FIG. 1, and the effect based on this mechanism can also be obtained similarly.

Furthermore, since the width d of the connection of the exciting cores 4a, 4b connected to the detecting core 2 is, substantial two times (2L) of a dimension L in a lengthwise direction of the sensor in this configuration, a ratio of the width d of the connection of the exciting core 4 against the magnetic path length of the detecting core 2 becomes considerably large, thus the residual magnetic flux density in the detecting core 2 can be reduced by the inverse magnetic field effect as compared with the configuration of FIG. 1, and a hysteresis phenomenon caused by the coercive force of the core material can be reduced.

Besides, since the entire configuration of the DC current sensor is symmetrical to the wire 1 being detected, it is electrically well balanced, thus the stable measurement can be realized.

Figure 12:
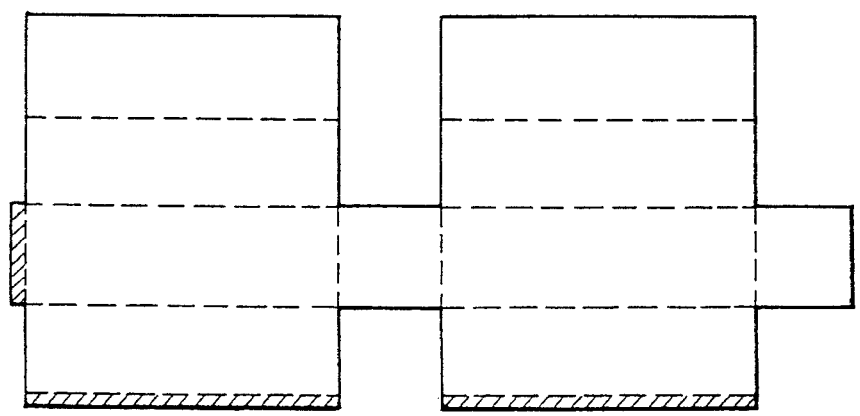
FIG. 12 is an explanatory expansion view for obtaining a core assembly in a configuration of a DC current sensor of the present invention shown in FIG. 11.

The detecting core 2 and the exciting cores 4a, 4b constituting the above-mentioned DC current sensor can be obtained easily as a body, by punching a plate material, consisting of a predetermined soft magnetic material, into a shape shown in FIG. 12, and assembling by bending along broken lines in the figure for spot welding at the portion shown by oblique lines.

Figure 13:
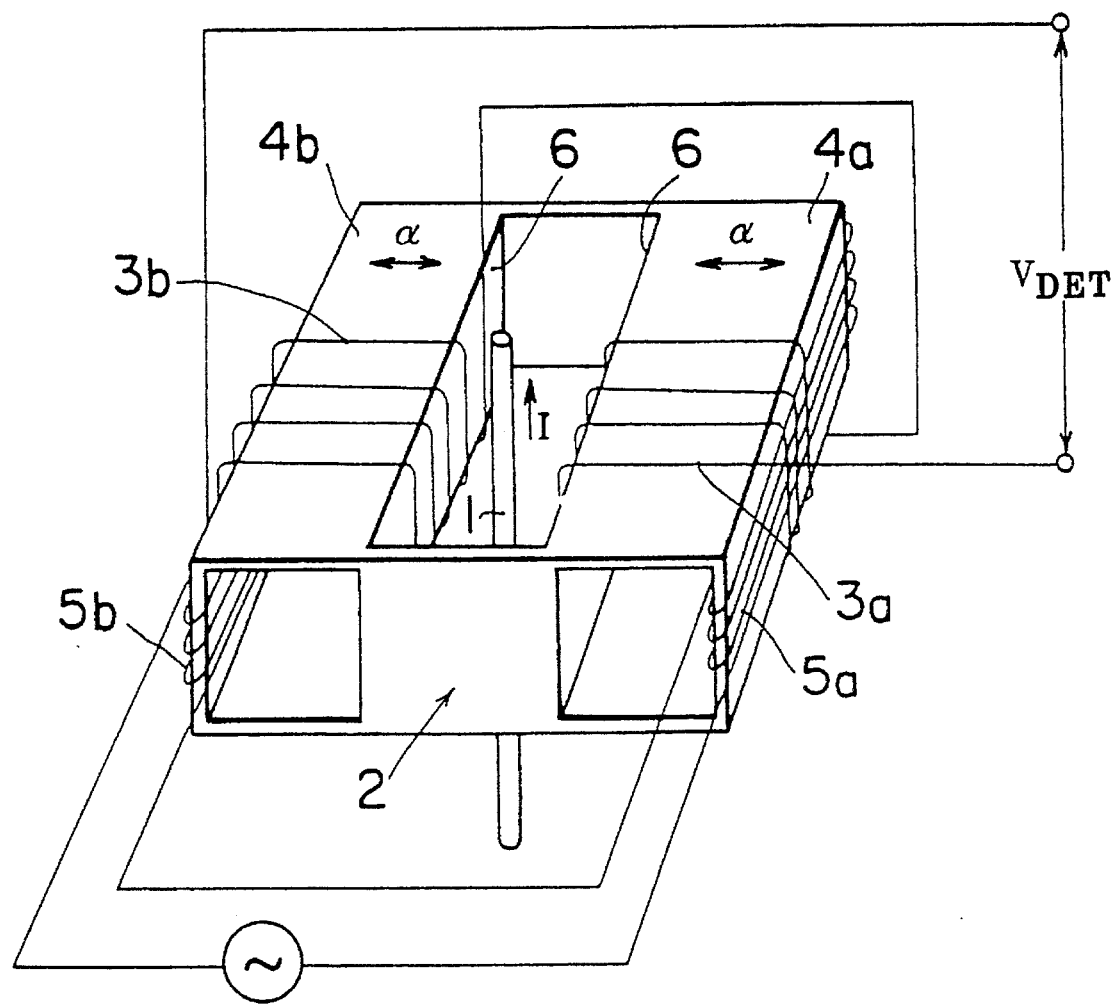
FIG. 13 and FIG. 14 are explanatory perspective views showing the other embodiment of a DC current sensor of the present invention.

FIG. 13 shows another embodiment which is constituted as same as those shown in FIG. 11, except that a pair of detecting coils 3a, 3b are wound around a pair of exciting cores 4a, 4b in a toroidal shape together with the exiting coil 5a, 5b. By the mechanism which is basically same as FIG. 1, the DC current flowing through the wire 1 being detecting can be detected.

Figure 14:
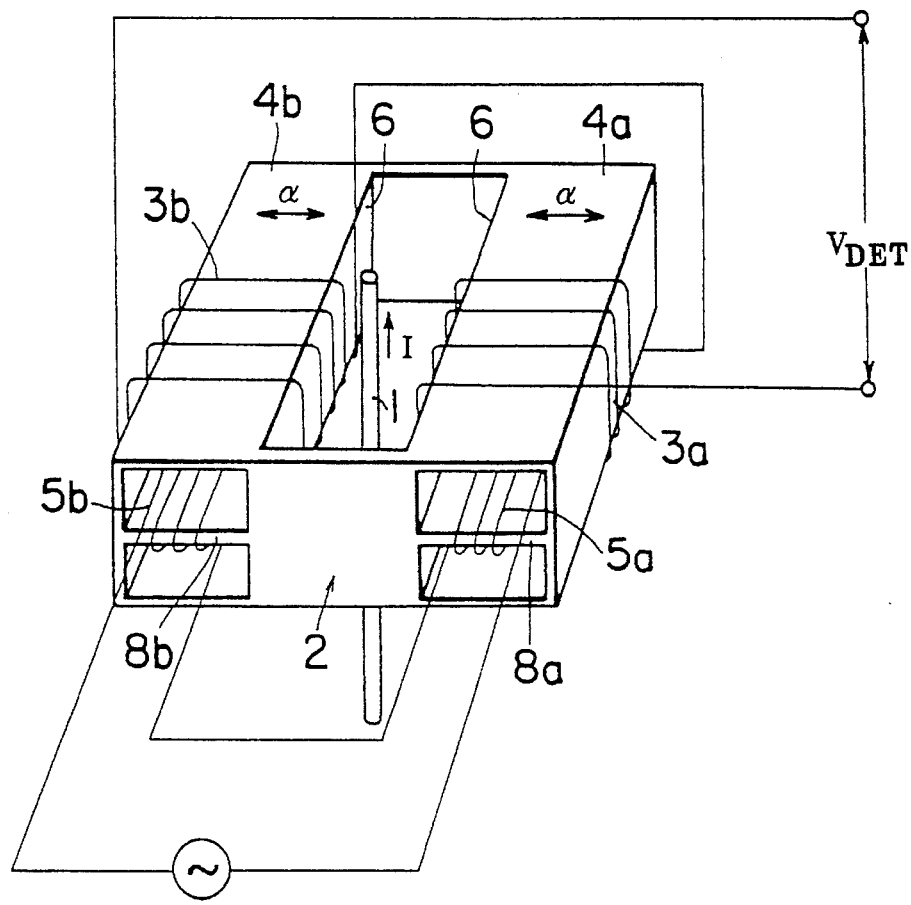

FIG. 14 also shows the other embodiment which is constituted as same as FIG. 13, except that a pair of exciting coils 5a, 5b are wound in a toroidal shape around exciting coil winding frames 8a, 8b formed at an inner center portion of the pair of exciting coils 4a, 4b disposed as forming a quadrangular tube shape. By the mechanism which is basically same as FIG. 1, the DC current flowing through the wire 1 being detected can be detected.

Figure 15:
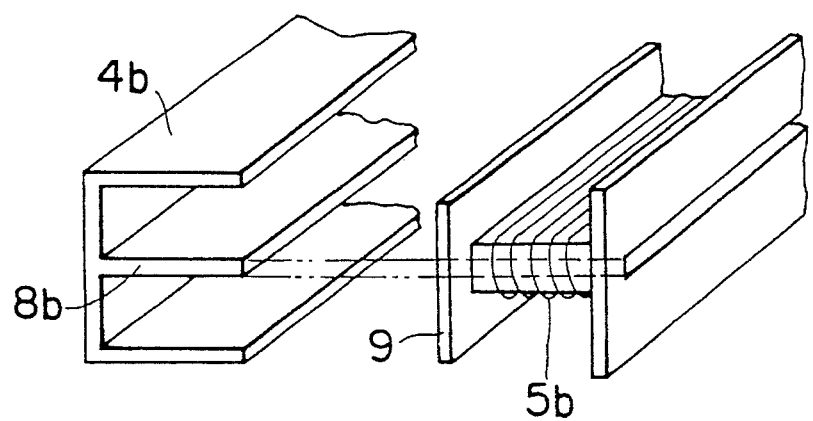
FIG. 15 is a partially explanatory view of a DC current sensor of the present invention shown in FIG. 14.

Particularly, in the configuration shown in FIG. 14, it can be manufactured easily in such a manner that, by forming the exciting cores 4a, 4b into an E-shaped section in a advance as shown in FIG. 15, the exciting coils 5a, 5b wound around a bobbin 9 consisting of a predetermined shape and size beforehand, is integrated with the rectangular frame-shaped detecting core by predetermined means after inserting into the exciting coil winding frames 8a, 8b.

Also, in the configuration shown in FIG. 13, there is a possibility that a magnetic flux generated in a pair of exciting cores 5a, 5b leaks from the exciting cores 4a, 4b, thereby an exciting signal mixes into the detecting coils 3a, 3b by the leaked magnetic flux, and particularly when detecting a micro electric current, the mixed signal level becomes higher than the detecting sign to deteriorate a sensitivity.

However, in the configuration shown in FIG. 14, the magnetic fluxes generated respectively in the exciting cores 5a, 5b operate efficiency without leaking from the exciting cores 4a, 4b, and the detecting coils 3a, 3b are not affected negatively.

Figure 16A:
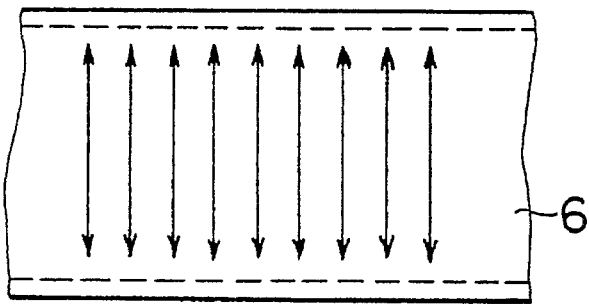
FIG. 16(A) and 16(B) are detailed explanatory views of a magnetic path generated by an exciting coil of a DC current sensor of the present invention shown in FIG. 14.
Figure 16B:
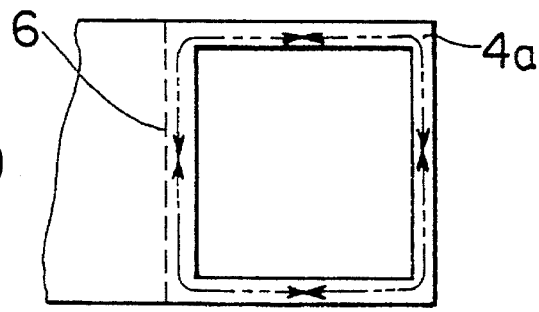
Figure 17A:
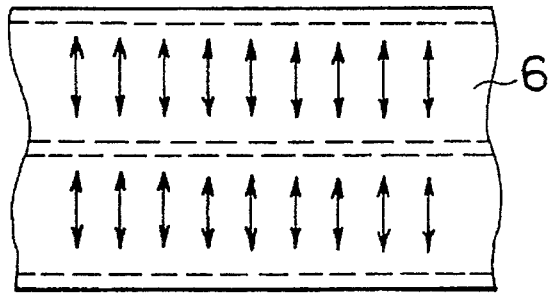
FIGS. 17(A) and 17(B) are detailed explanatory views of a magnetic path generated by an exciting coil of a DC current sensor of the present invention shown in FIG. 14.
Figure 17B:
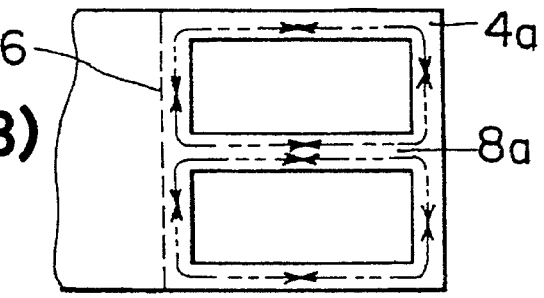

Meanwhile, in respective configurations, when viewing the magnetic path in the intersections 6 of the detecting core 2 and the exciting cores 4a, 4b, in the configuration shown in FIG. 13, as shown in FIGS. 16(A) and (B), though the magnetic path of one circuit basically acts such that the direction of the magnetic flux changes alternately, in the configuration shown in FIG. 14, as shown in FIGS. 17(A) and (B) the magnetic path of the two circuits basically acts, via the exciting coil winding frames 8a, 8b, such that the direction of the magnetic flux acts to change alternately, so that the electromagnetic balance is more improved.

When adopting the configuration shown in FIG. 14, it is desirable to set the thickness of the exciting coil winding frames 8a, 8b two times thicker than the other portions in advance, because the magnetic flux concentrates in the exciting coil winding frame 8a, 8b.

Figure 18:
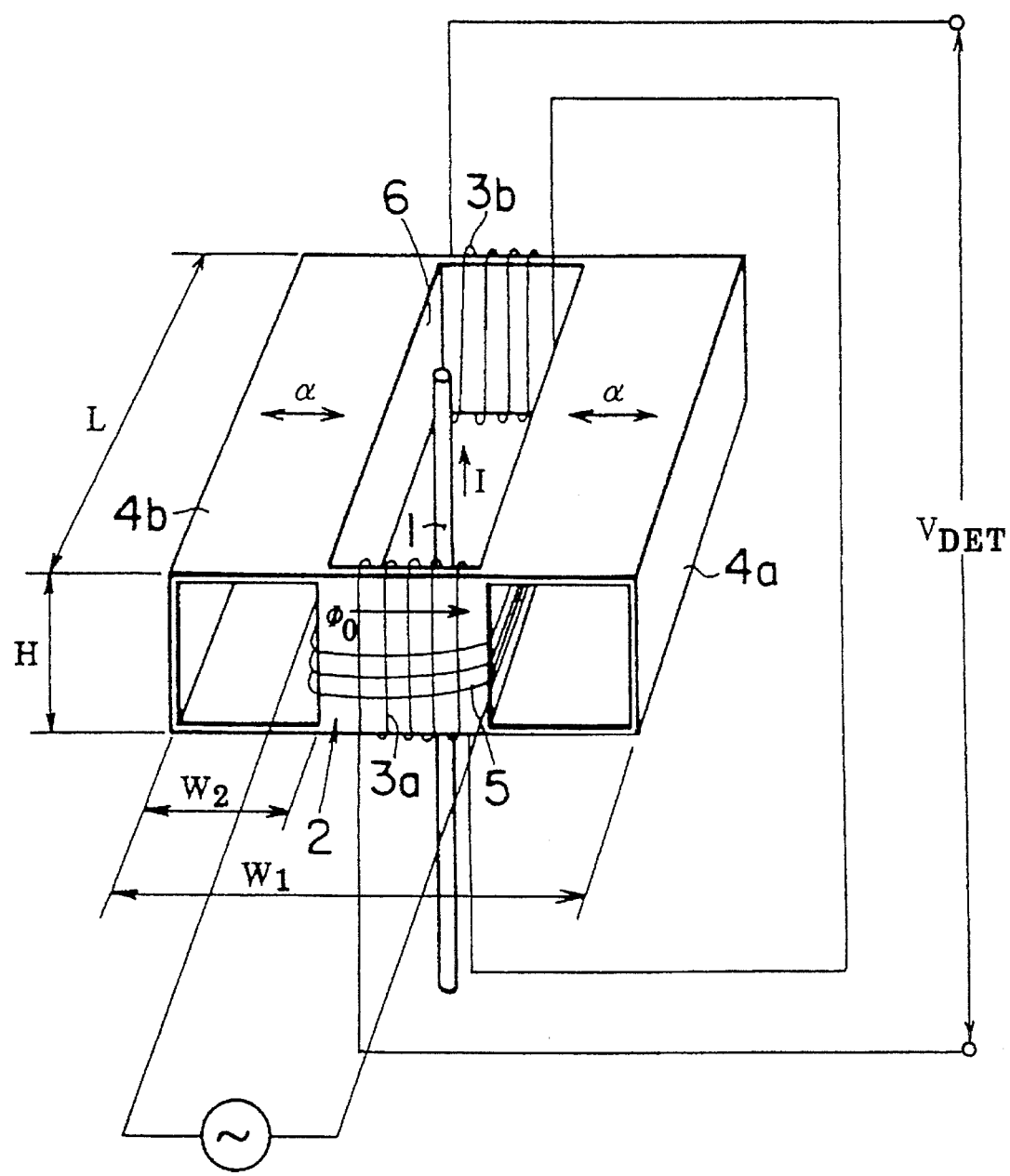
FIG. 18 and FIG. 19 are explanatory perspective views showing the other embodiment of a DC current sensor of the present invention.
Figure 19:
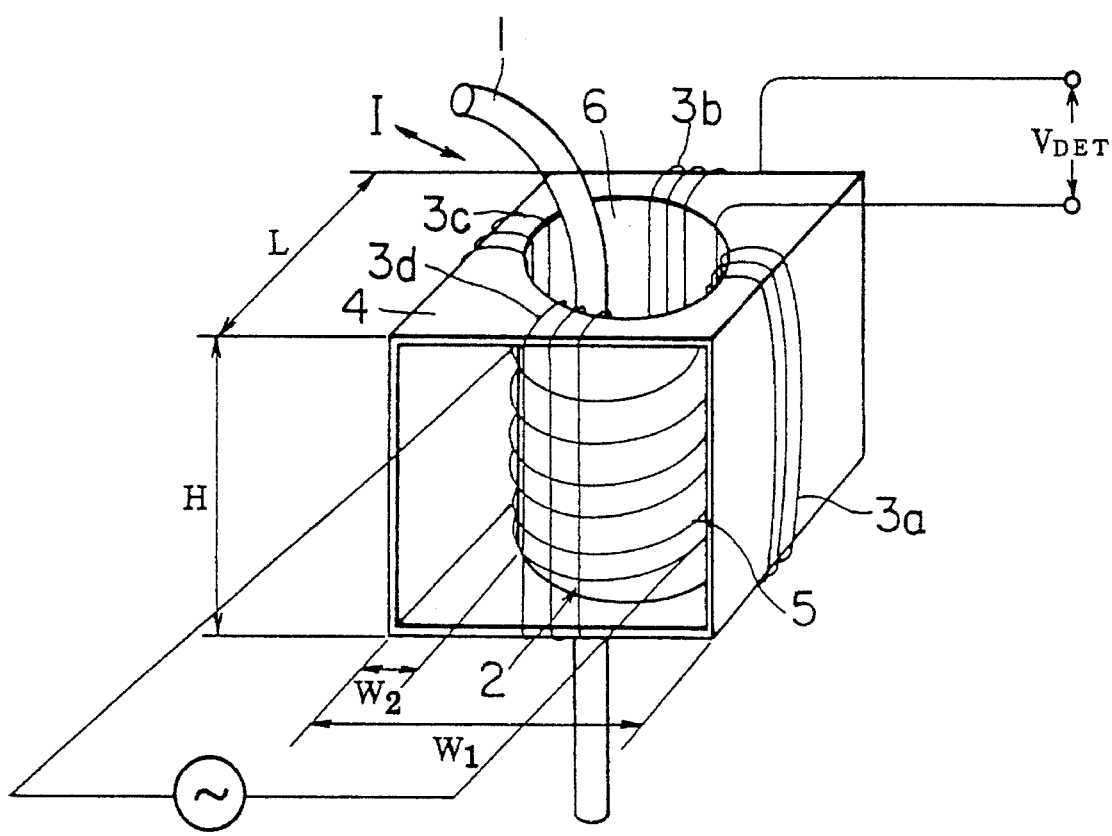

For the purpose of obtaining the same effect as the DC current sensor consisting of the above-mentioned configuration, one embodiment improved from the basic configuration shown in FIG. 10 is described according to a perspective explanatory views of FIG. 18 and FIG. 19.

In FIG. 18, numeral 1 designates a wire being detected, which is extended through an inner center portion of a rectangular frame-shaped detecting core 2. A pair of detecting coils 3a, 3b are wound in a toroidal shape around short side portions at the opposite locations of the rectangular frame-shaped detecting core 2, and are interconnected electrically. A pair of exciting cores 4a, 4b are disposed in a body at long side portions at the opposite locations so as to form a quadrangular tube shape. Meanwhile, an exciting core 5 is wound circumferentially around the rectangular frame-shaped detecting core 2.

In other words, it is constituted such that, a pair of quadrangular tube bodies serving as the exciting cores 4a, 4b are arranged in parallel to a center axis line, adjoining side portions of respective opening ends of the quadrangular tube bodies are connected in a body by a connecting plate consisting of a soft magnetic material to form the rectangular frame-shaped detecting core 2, by the connecting plate and the side faces of the quadrangular tube bodies connected thereto or the core intersection 6, wherein the detecting coils 3a, 3b, are wound respective around the connecting plate portion in a toroidal shape, and the exciting coil 5 is wound around the detecting core 2.

When the DC current I is applied to the wire 1 being detected in such configuration, a magnetic field clockwise to the direction of the DC current I is generated in the detecting core 2 to generate a magnetic flux $\Phi_0$ therein.

At this time, when a predetermined AC current applied to the exciting coil 5 to generate the magnetic flux, which changes periodically in a direction ∝ in the figure in a pair of exciting cores 4a, 4b, and to magnetically saturate the exciting cores 4a, 4b periodically, the core intersection 6 of the long side portion which is circumferential portion of the rectangular frame-shaped detecting core 2 becomes a so-called, substantially, magnetic gap where a specific magnetic permeability μ is very close to 1, thereby the magnetic flux $\Phi_0$ in the detecting core reduces to $\Phi_1$.

Thus, also the DC current sensor of the present invention shown in FIG. 18 has the electromotive force generating mechanism to the pair of detecting coils 3a, 3b, which is constituted as same as those shown in FIG. 10, and the effect based on this mechanism can also be obtained similarly.

Furthermore, since the width d of the connecting portion of the exciting cores 4a, 4b connected to the detecting core 2 is, substantially, two times (2L) of a dimension (L) in a lengthwise direction of the sensor shown in this configuration, a rate of the width d of the connection of the exciting core 4, against the magnetic path length of the detecting core 2, becomes considerably large, thus the residual magnetic flux density in the detecting core 2 is further reduced by the inverse magnetic field effect, and the occurrence of "inverse region" can be considerably decreased.

Besides, since the entire configuration of the DC current sensor is symmetrical to the wire 1 being detected, it is electrically well balanced, thus the stable measurement can be realized.

FIG. 19 is also a perspective explanatory view showing a DC current sensor, which is one embodiment of the present invention improved from the basic configuration shown in FIG. 10, and particularly, it is constituted so as to be miniaturized easily as compared with the other embodiments.

Though the DC current sensor shown in FIG. 19 does not basically differ from the configuration shown in FIG. 10 and FIG. 18, it is constituted such that, a cylindrical core is extended through a rectangular parallel-piped core so as to intersect perpendicularly in an opening direction of the rectangular parallel-piped core whose two opposite faces are open in one direction, the cylindrical core serving as the detecting core 2 and the rectangular parallel-piped core serving as the exciting core 4, detecting coils 3a, 3b, 3c and 3d are respectively wound in a toroidal shape at symmetrical locations (four locations are shown) of the detecting core 2 consisting of a cylindrical soft magnetic material, the exciting coil 5 is wound around the detecting core 2 and further, the wire 1 being detected extending through the cylindrical detecting core 2 is disposed.

Figure 20:
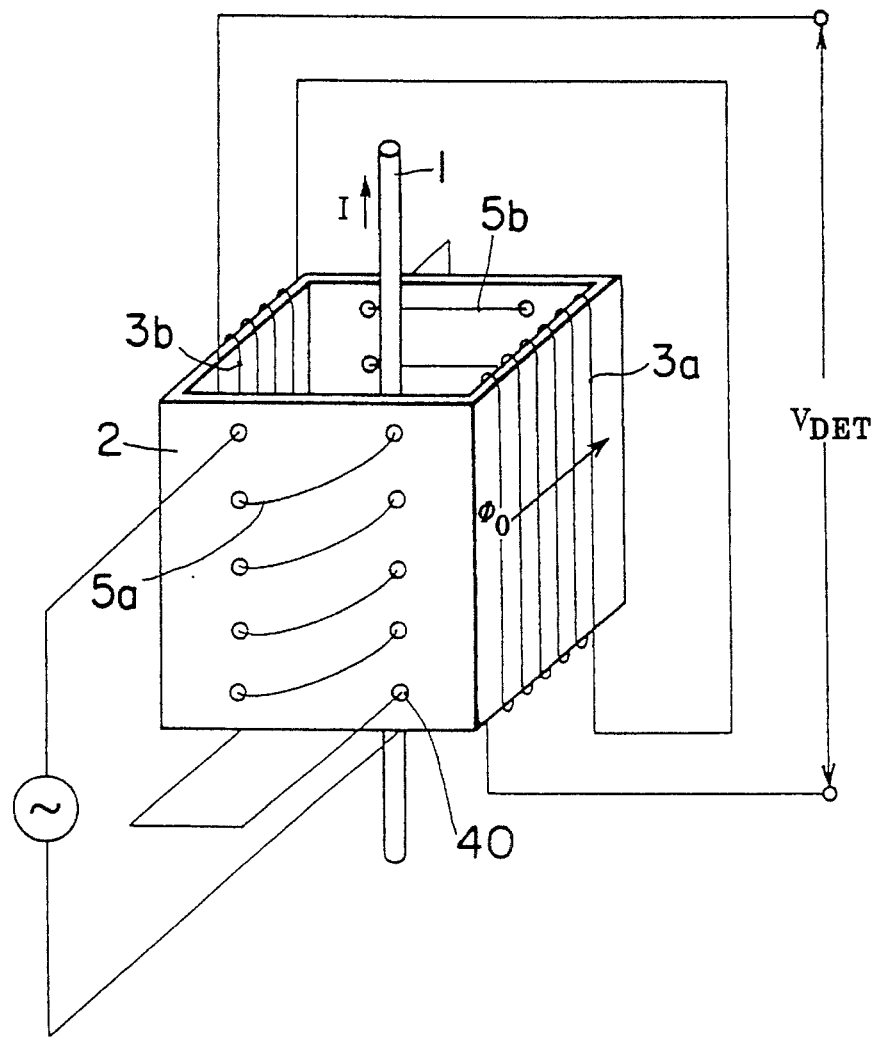
FIG. 20 is an explanatory perspective view showing the other basic construction of a DC current sensor of the present invention.

In the DC current sensor of the present invention shown in FIG. 1 and FIG. 10, and further, consisting of a number of embodiments basically constituted according to FIG. 1 and FIG. 10, though a magnetic gap is formed by magnetically saturating the intersection 6 of the detecting core 2 and the exciting core 4 periodically in any cases, in the DC current sensor according to the other embodiment of the present invention shown in FIG. 20, the object of the invention can be achieved without using the exciting core.

In FIG. 20, numeral 1 designates a wire being detected which is extended through a detecting core 2 consisting of an annular soft magnetic material. Numerals 3a, 3b designate detecting coils wound in a toroidal shape on opposite side faces of the detecting core 2, which secure electrical insulation against the wire 1 being detected and are connected to a predetermined detecting circuit (not shown).

Numerals 5a, 5b designate exciting coils wound via a plurality of through holes 40 formed in opposite side faces of the detecting core 2 other than those wound with the detecting coils 3a, 3b.

When a DC current I is applied to the wire t being detected in this configuration, a magnetic field clockwise to the direction of the DC current I is generated in the detecting core 2 to generate a magnetic flux $\Phi_0$ therein.

When an electric current is not flowing through the exciting coils 5a, 5b in such state, since the plurality of through holes 40 are sufficiently smaller than a width of the detecting core 2, they do not substantially act as magnetic resistance, thus the magnetic flux $\Phi$ passes easily therethrough to form a magnetic path in the circumferential direction of the detecting core 2.

Figure 21:
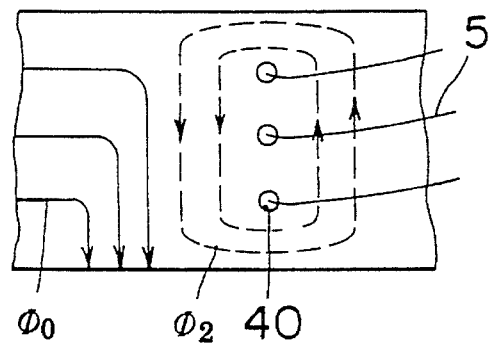
FIG. 21 is a partially explanatory view for explaining an operation principle of a DC current sensor of the present invention.

However, when a predetermined AC current is applied to the exciting coils 5a, 5b, the magnetic flux is generated around the plurality of through holes 40 formed in the detecting core 2, and a magnetic flux $\Phi_2$ which is substantially perpendicular to the magnetic flux $\Phi_0$ and acts in the entire width-wise direction (vertical direction in the figure) at a circumferential portion of the detecting core 2, as shown by broken lines in FIG. 21, is formed.

The magnetic flux $\Phi_0$ based on the DC current I flowing through the wire 1 being detected, and the magnetic flux $\Phi_2$ based on the AC current flowing through the exciting coils 5a, 5b intersect one another in a perpendicular direction, and when magnetic flux $\Phi_0 \leq$ magnetic flux $\Phi_2$, the magnetic flux $\Phi$ can not proceed straightly in the detecting core 2 due to the mutual repulsive actions, thereby a magnetic gap, which interrupts the magnetic path formed in the circumferential direction of the detecting core 2, is formed periodically at that portion.

Even in such configuration, as same as the DC current sensors according to the present invention of FIG. 1 and FIG. 10, an electromotive force, proportional to the DC current I flowing through the wire 1 being detected, can be detected by the detecting coils 3a, 3b.

As shown above, though the DC current sensor of the present invention is constituted by effectively arranging an annular soft magnetic material as the detecting core and the exciting core or the detecting core, it is preferable to select the soft magnetic material responsive to the magnitude of electric current flowing through the wire being detected or a detecting sensibility required for the sensor. Though usually, permalloy is preferable when considering the workability as well as magnetic characteristics, it is possible to use known soft magnetic material such as a silicon steel plate, amorphous, electromagnet soft iron and soft ferrite and combinations thereof.

In the present invention, the annular soft magnetic material is not limited to a so-called ring-shaped soft magnetic material, the soft magnetic material maybe just connected to constituted an electromagnetic closed circuit, thus besides an annular ring, various configurations such as an elliptical ring, rectangular frame and the like can be adopted as shown.

The magnetic gap formed in the detecting core is not limited to one location in the detecting core, it may be formed at plural locations, and as shown in various embodiments described heretofore, it is desirable to set the forming location taking into consideration of the electromagnetic balance.

In the DC current sensors of the present invention according to FIG. 1 or FIG. 10 and those based on their configurations, as to the magnetic saturation at a core intersection of the detecting core and the exciting core, for example, even when the core intersection does not intersect perpendicularly and the complete saturation is not achieved, as far as the substantially saturated state is obtained, the object of the invention can be achieved.

Thus, by selecting optimum conditions on the shape and dimension of the soft magnetic material and the number of turns of the detecting coil and the exciting coil besides the soft magnetic material, a sensor having a higher practicability can be provided.

Meanwhile, in the present invention, the wire being detected extending through the detecting core is not limited to one, the plural wires being detected may be extended through responsive to the required size of the sensor, but the effect of the invention can be realized most effectively by limiting the wire being detected to one.

By the above description, the basic configuration of the DC current sensor of the present invention and a number of embodiments improved therefrom were introduced. The inventor has also made various improvements to enhance the practicability of these DC current sensors.

For example, by adding means for detecting a directivity of an electric current, or means for reducing the hysteresis of output characteristics caused by the hysteresis included in the core itself, to the DC current sensor constituted as described above, the DC current sensor can be used more widely.

In the following, one embodiment of the DC current sensor of the present invention, to which various means are added, is described.

By viewing the fact that phases of the voltage $V_{DET}$ having the frequency $2f_0$ generated in the detecting coil 3 respectively differ by 180°, depending on the direction of the DC current I flowing through the wire 1 being detected, as described by FIG. 2 and FIG. 3 as an operating principle of the DC current sensor of the present invention shown in FIG. 1, it has been confirmed that, an absolute value of the DC current flowing through the wire being detected and its direction can be easily detected, by applying an exciting current in a state, where the exciting current frequency oscillated from an oscillator at a double frequency of the exciting current is divided into half beforehand, to the exciting coil 5, and detecting the phase difference between the oscillator output and the detecting coil output by a phase comparison circuit.

That is, since both the frequency of the exciting current oscillated from the oscillator connected to the exciting coil 5, and the frequency of the output $V_{DET}$ from the detecting coil 3 finally show the frequency $2f_0$ which is two times of the exciting current applied to the exciting coil 5, these phase differences can be easily compared, and the direction of the DC current flowing through the wire being detected can be detected.

Thus, the DC current sensor of the present invention is constituted such that, a core intersection which is connected perpendicularly in a circumferential direction of the detecting core is provided at a portion of the detecting core consisting of an annular soft magnetic material, to dispose the exciting core consisting of an annular soft magnetic material in a body, and the detecting coil and the exciting coil wound in a toroidal shape around the respective cores are disposed, wherein a wire being detected, through which a DC current for isolate detection is flowing, is extended through the detecting core, AC current applying means, which divides the frequency of the exciting current oscillated from the oscillator at a double frequency of the exciting current into half beforehand, and magnetically saturates the core intersection periodically by the exciting current, is connected to the exciting coil, thereby the magnetic flux generated in the detecting coil in response to the DC current flowing through the wire being detected at the time of excitation can be modulated, outputting the electromotive force having a double frequency of the exciting current from the detecting coil, and further, the phase difference between the oscillator output and the detecting coil output is detected by phase comparison means, and an absolute value and the direction of the DC current flowing through the wire being detected can be detected.

Since the operation principle (an electromotive force generating mechanism) of the DC current sensor of the present invention shown in FIG. 10 is similar to those shown in FIG. 1, the DC current sensor constituted such that, a core intersection which is connected perpendicularly in a circumferential direction of the detecting core is provided at a portion of the detecting core consisting of an annular soft magnetic material to dispose the exciting core consisting of an annular soft magnetic material in a body, the detecting coil is wound in a toroidal shape around the detecting core, and the exciting coil wound in a circumferential direction of the detecting core is wound around the detecting core, wherein a wire being detected through which a DC current for isolate detection is extended through the detecting core, AC current applying means, which divides the frequency of the exciting current oscillated from the oscillator at a double frequency of the exciting current into half beforehand, and magnetically saturates the core intersection periodically by the exciting current, is connected to the exciting coil, thereby the magnetic flux generated in the detecting coil in response to the DC current flowing through the wire being detected at the time of excitation can be modulated, outputting the electromotive force having a double frequency of the exciting current from the detecting coil, and further, the phase difference between the oscillator output and the detecting coil output is detected by phase comparison means, and an absolute value and the direction of the DC current flowing through the wire being detected can be detected, is proposed together.

Furthermore, it is not limited to the DC current sensors constituted as shown in FIG. 1 and FIG. 10, as far as the DC current sensor is constituted such that, a voltage $V_{DET}$ having a frequency $2f_0$ is generated in the detecting coil 3 applying an AC current having a frequency $f_0$ to the exciting coil 5 as an exciting current, by an electromotive force generating mechanism as shown in FIG. 2 and FIG. 3, it is possible to easily detect an absolute value and the direction of the DC current flowing through the wire being detected, by applying an exciting current in a state, where the frequency of the exciting current oscillated from an oscillator at a double frequency of the exciting current is divided into half beforehand, to the exciting coil 5, and detecting the phase difference of the oscillator output and the detecting coil output by a phase comparison circuit.

The operation of these DC current sensor is described for the case of most simple configuration shown in FIG. 1. Though FIG. 22 shows one embodiment of a construction of electric circuit, an electric circuit configuration connected to the DC current sensor of the present invention is not limited to the configuration shown.

As described previously, the DC current sensor shown in FIG. 1 is constituted such that, a detecting coil 3 is wound in a toroidal shape around a detecting core 2 consisting of an annular soft magnetic material, through which a wire 1 being detected is extended, an exciting core 4 consisting of an annular soft magnetic material is connected perpendicularly in a circumferential direction of the detecting core 2, and disposed at a portion of the detecting core 2 in a body, and an exciting coil 5 is wound in a toroidal shape around the exciting core 4.

Hereupon, an exciting current in a state, where a frequency of the exciting current oscillated from an oscillator at a double frequency $f_0$ of the exciting current is divided into half beforehand, is applied to the exciting coil 5.

Figure 22:
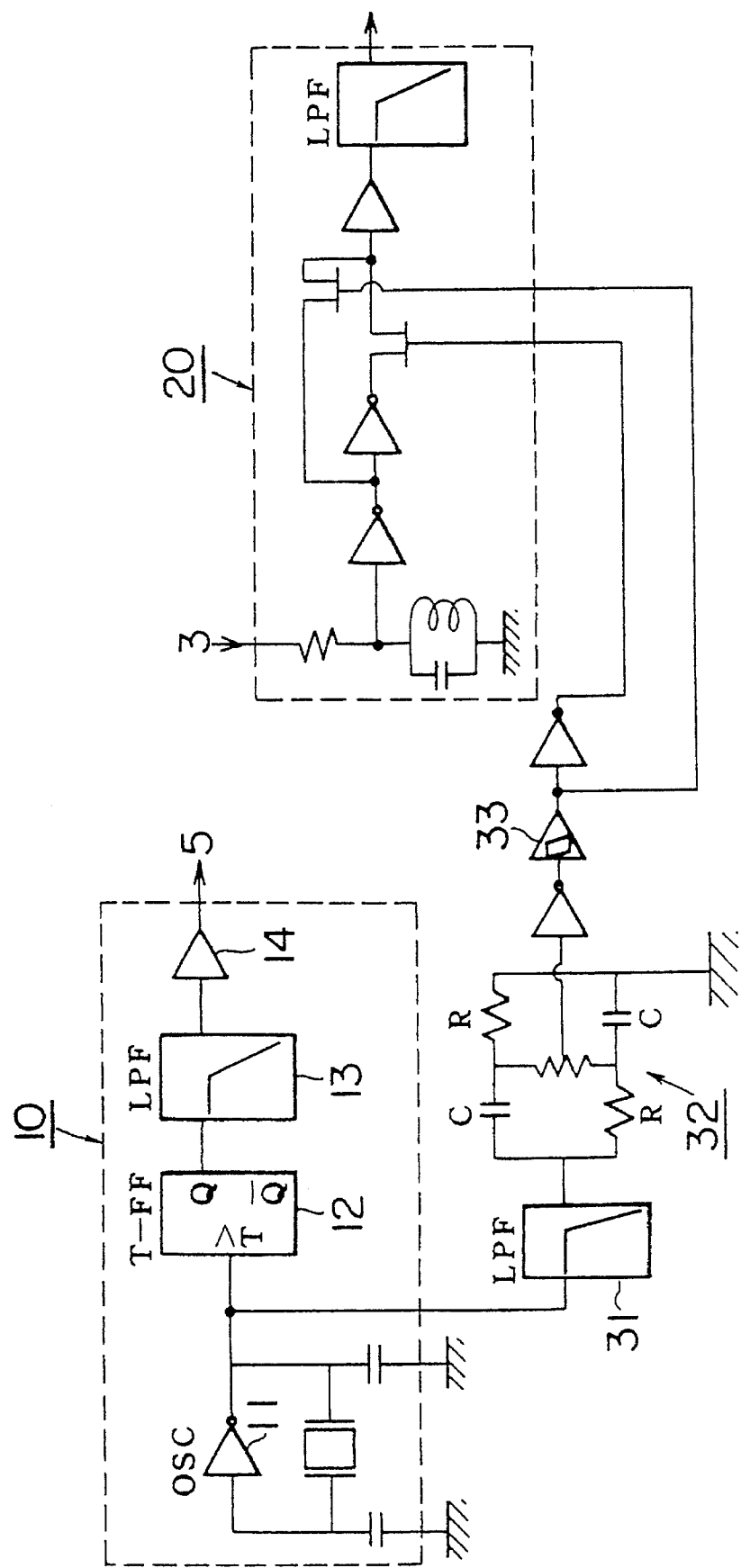
FIG. 22 is an explanatory view showing an outline of one embodiment of an electric circuit connected to a DC current sensor of the present invention.

That is, as shown in FIG. 22, the exciting coil 5 is connected to AC current applying means 10. The AC current applying means 10 is constituted by an OSC (oscillation circuit) 11 which oscillates the exciting current having a double frequency $2f_0$ of the exciting current applied to the exciting coil 5 finally, and a T-FF (Trigger flip-flop) 12 which divides the exciting current frequency into half, and further, connects an AC current, whose frequency is divided once from $2f_0$ to $f_0$, to the exciting coil 5 via a LPF (low-pass filter) 13 and a buffer amplifier 14.

When a DC current I is applied to the wire 1 being detected (refer to FIG. 1) in a predetermined direction, by the exciting current having the frequency $f_0$ divided into half applied to the exciting coil 5, as same as an electromotive force generating mechanism previously described, the magnetic flux generated in the detecting core 2 is modulated, the electromotive force, consisting of a double frequency $2f_0$ of the exciting current proportional to the DC current I flowing through the wire 1 being detected, can be outputted from the detecting coil 3, and an absolute value of the DC current I flowing through the wire 1 being detected can be known.

As described with reference to FIG. 2 and FIG. 3, there is the 180° phase difference in a voltage $V_{DET}$ of frequency $2f_0$ generated in the detecting coil 3, depending on directions of the DC current I flowing through the wire 1 being detected.

An output (electromotive force) consisting of the frequency $2f_0$ generated in the detecting coil 3 in such a manner is inputted to the phase comparison circuit 20 shown in FIG. 22.

While, a portion of exciting current consisting of the frequency $2f_0$ oscillated from the OSC 11 constituting the AC current applying means 10, is inputted to the phase comparison circuit 20 shown in FIG. 22, via a LPF (low-pass filter) 31, a phase shifter 32, a Schmitt trigger 33 and so on as keeping the frequency $2f_0$, without being connected to the exciting coil 5 via the T-FF 12 and so on.

Constants of components parts used in the phase shifter 32 are desirably arranged on the condition satisfying $f_{osc}=\frac{1}{2}nRC$.

The phase comparison circuit 20 detects the phase difference between the output from the oscillator 11 inputted to the circuit 20 and the output from the detecting coil 3, and outputs the output voltage $V_{OUT}$ of plus (+) or minus (−) finally changing substantially linearly responsive to the direction of the DC current Z flowing through the wire 1 being detected.

That is, as it can be understood from FIG. 2 and FIG. 3, when there is no phase difference between the output from the oscillator 11 and the output from the detecting coil 3, it is judged that the DC current Z flows in the wire 1 being detected in a direction of plus (+) (upward in FIG. 1), and when the phase difference is 180°, it is judged that, the DC current I flows in the wire 1 being detected in a direction of minus (−) (downward in FIG. 1), thereby it is possible to output the direction as well as the absolute value of the DC current I.

Particularly, in the DC current sensor of the present invention, since both the frequency of the exciting current oscillated from the oscillator 11 connected to the exciting coil 5 and the frequency of the output $V_{DET}$ from the detecting coil 3 become a double frequency $2f_0$ of the exciting current applied to the exciting coil 5 finally, the phase difference of the outputs consisting of this same frequency can be compared easily, thus the direction of the DC current flowing through the wire being detected can be detected by the known phase comparison circuit 20 having a relatively simple configuration as shown in FIG. 22.

The operation of the invention described above is same for not only the DC current sensor having the configuration shown in FIG. 1, but also for the DC current sensor having the configuration shown in FIG. 10 and those shown in FIG. 11, FIG. 13, FIG. 14, FIG. 18, FIG. 19 and FIG. 20. In respective configurations, the effect making a good use of features described previously can be realized.

Besides the above-mentioned means for adding an electric circuit, it has been confirmed that, it is possible to detect the absolute value as well as the direction of the DC current flowing through the wire being detected, by giving a deflection magnetic field in the detecting core by applying an electric current, whose magnitude and direction change linearly against the time periodically, for example, the electric current which changes in a triangular wave shape.

Figure 23:
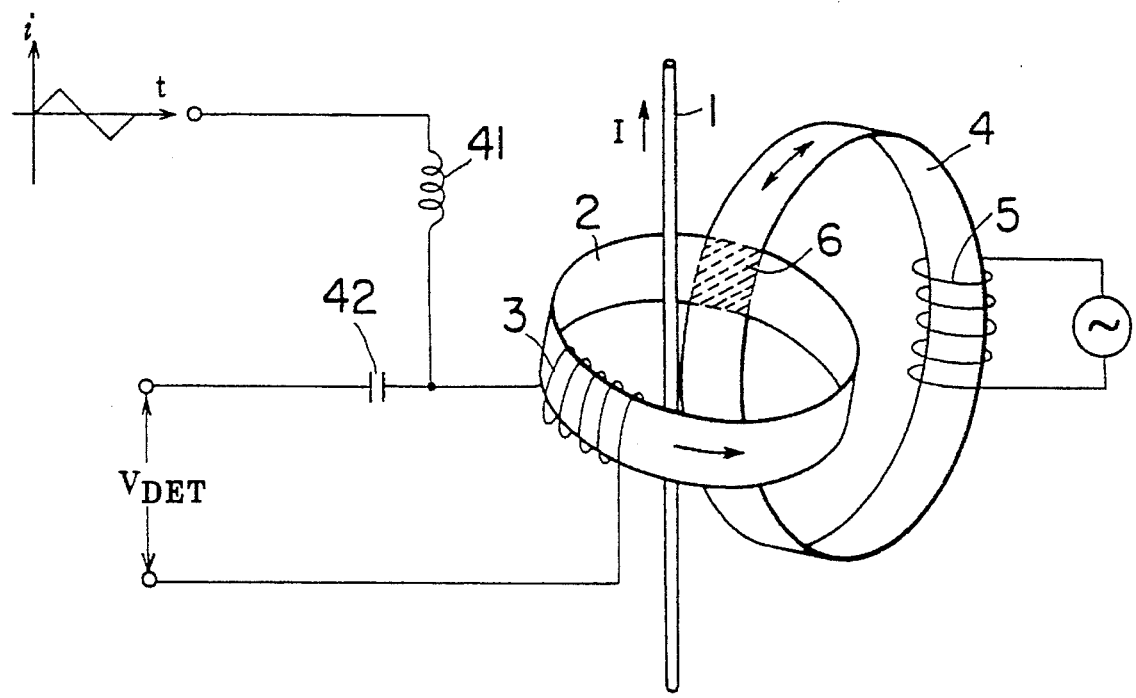
FIG. 23 is an explanatory view showing an outline of one embodiment of an electric circuit connected to a DC current sensor of the present invention.

In FIG. 23, though a body of the DC current sensor is shown in a basic configuration shown in FIG. 1, the operation and effect shown in the following are not limited to this configuration.

FIG. 41 shows an inductor for reflecting detecting signal invasion consisting of a choke coil and the like, and FIG. 42 shows a detecting signal by-pass capacitor.

The operation principle is described with reference to FIG. 24 and FIG. 25.

FIG. 24 is an explanatory view of an output generated in the detecting coil 3 in a state, where the current I is not flowing through the wire 1 being detected.

Figure 24A:
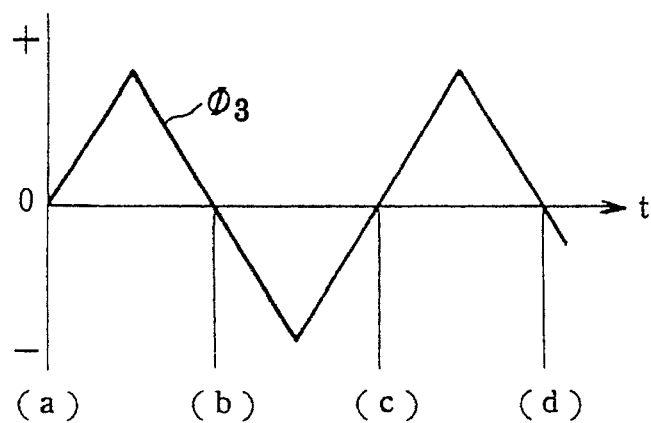
FIGS. 24A, 24B and 24C and 24D are graphs showing changes in a duty ratio (a time ratio in a plus (+) direction and a minus (−) direction) of an output of a detecting coil.
Figure 24B:
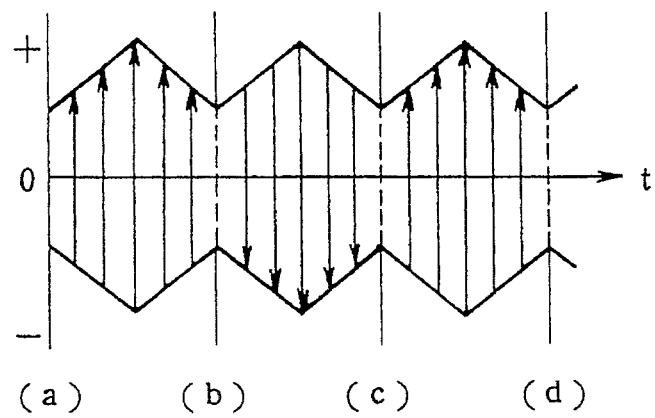
Figure 24C:
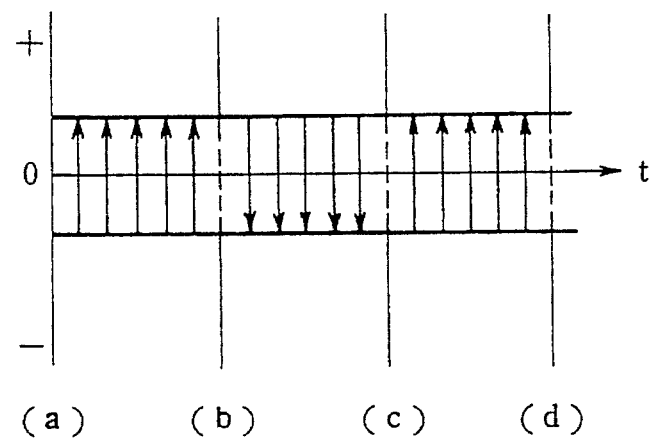
Figure 25A:
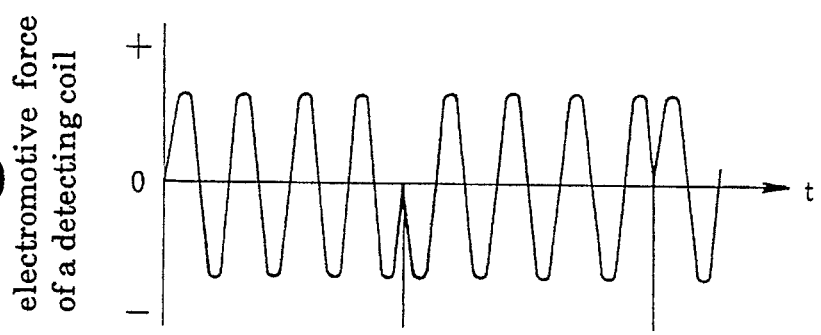
FIGS. 25A and 25B are explanatory views defining an indication method of an electromobile force of a detecting coil in FIG. 24.
Figure 25B:
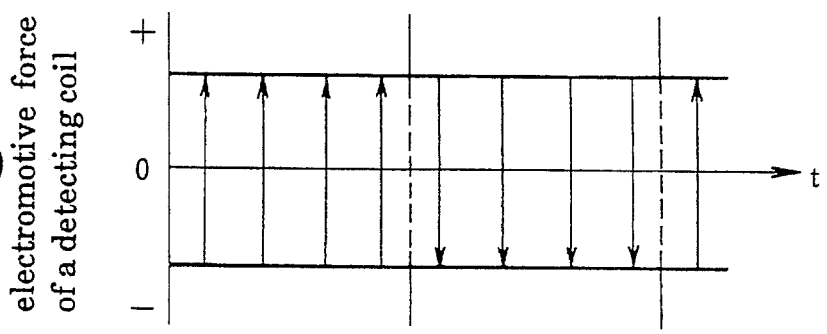

When the triangular wave-shaped current, whose direction and magnitude change linearly periodically, is applied to the detecting coil 3, a magnetic flux $\Phi_3$ as shown in FIG. 24(A) is generated in the detecting core 2, and an electromotive force as shown in FIG. 24(B) is generated in the detecting coil 3. Directions of arrows in the figure show phase of the electromotive force. In FIG. 24(B), between a to b and b to c, the phase difference is 180°. That is, for the purpose of understanding the operation principle of the invention easily, the phase directions are shown by the arrows, as shown in FIG. 25(B), for the electromotive power having the phase difference as shown in FIG. 25(A) (description of FIG. 26 is also same).

When a electromotive force as shown in FIG. 24(B) is passed through a limiter and its wave height is restricted, an output as shown in FIG. 24 (C) is obtained, and by phase detection of the output, an output as shown in FIG. 24 (D) is obtained.

Figure 24D:
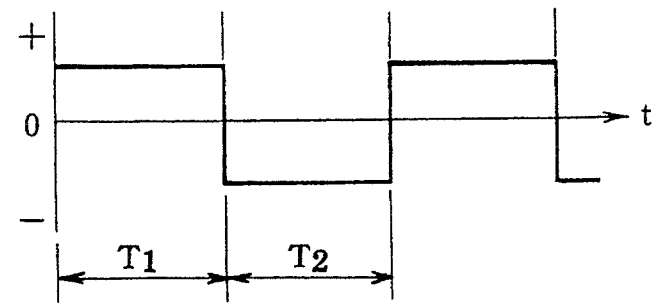

In FIG. 24(D), an output time $T_1$ on the plus (+) side and an output time $T_2$ on the minus (−) side are measured to detect a duty ratio.

In a state where the current I is not flowing through the wire 1 being detected, as shown in FIG. 24 (D), the output time $T_1$ on the plus (+) side and the output time $T_2$ of the minus (−) side are equal, and their difference $(T_1-T_2)$ is zero.

FIG. 25 is an explanatory view on an output generated in the detecting coil 3 in a state, where the current I is flowing through the wire 1 being detected.

Figure 26A:
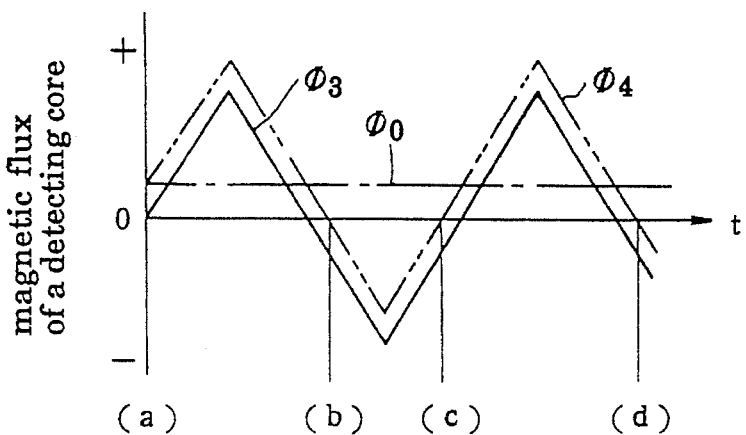
FIGS. 26A, 26B, 26C and 26D are graphs showing changes in a duty ratio of an output of a detecting coil.
Figure 26B:
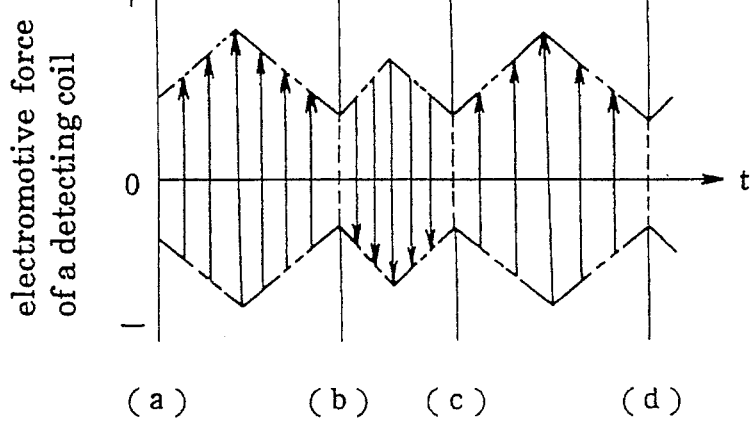
Figure 26C:
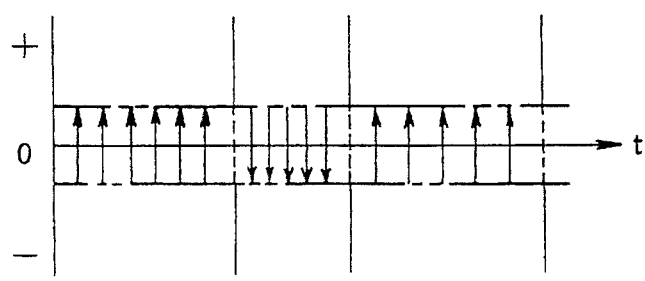

When the triangular wave-shaped current whose direction and magnitude change linearly periodically is applied to the detecting coil 3, a magnetic flux $\Phi_4$ as shown in FIG. 26(A) is generated in the detecting core 2, and an electromotive force as shown in FIG. 26(B) is generated in the detecting coil 3.

That is, the magnetic flux $\Phi_3$ generated by the triangle wave-shaped current and magnetic flux $\Phi_0$ generated by the current I flowing through the wire 1 being detected are overlapped $(\Phi_4=\Phi_3+\Phi_0)$.

When the electromotive force as shown in FIG. 26(B) is passed through the limiter and the wave height is restricted, an output as shown in FIG. 26 (C) is obtained, and by phase detection of this output, an output as shown in FIG. 26 (D) is obtained.

Figure 26D:
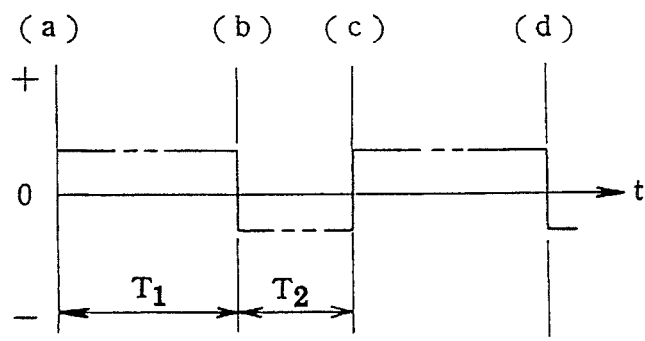

In FIG. 26(D), the output time $T_1$ on the plus (+) side and the output time $T_2$ on the minus (−) side are measured to detect a duty ratio.

In a state where the DC current I is flowing through the wire 1 being detected, as shown in FIG. 26 (D), the output time $T_1$ on the plus (+) side is longer than the output time $T_2$ on the minus (−) side, and the difference $(T_1-T_2)$ becomes plus $(T_1-T_2>0)$.

Since the difference $(T_1-T_2)$ is proportional to the current I flowing through the wire 1 being detected, by measuring correlation of the detected value and the current I in advance, an absolute value of the current I can be known.

By confirming and setting the case where the difference $(T_1-T_2)$ is plus $(T_1-T_2>0)$ or minus $(T_1-T_2<0)$, and the direction of the current I flowing through the wire 1 being detected, the direction of the current I can be detected simultaneously with the absolute value.

Furthermore, when a maximum value of a current applied to the detecting coil 3 is set sufficiently to generate a magnetic field above a coercive force (±Hc) of the material of the detecting core 2, a hysteresis of output characteristics caused by a hysteresis of the material of the detecting core 2 can be reduced.

That is, when the coercive force of the material of the detecting core 2 is considered in addition to the operation principle described in FIG. 24 and FIG. 26, the magnetic flux generated in the detecting core 2 becomes as shown in FIG. 27 (C) or FIG. 27 (D), and the output generated in the detecting coil 3 finally shows the same characteristics.

Figure 27A:
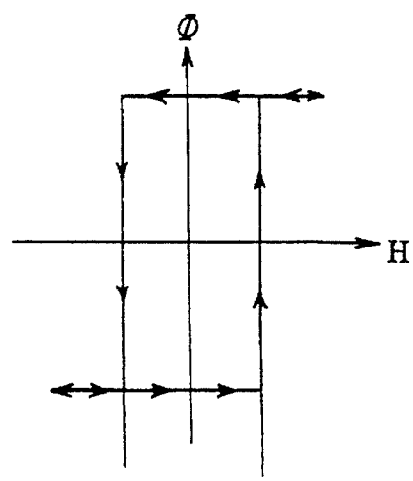
FIG. 27A, 27B, 27C and 27D are graphs showing changes in a duty ratio of a magnetic flux in a detecting core.
Figure 27B:
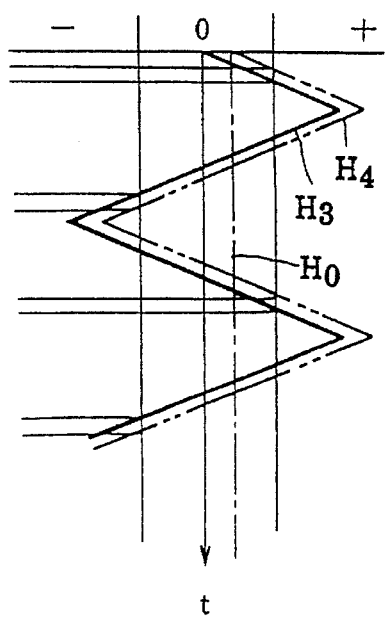

When the current I is not flowing through the wire 1 being detected and the triangular wave-shaped current is applied to the detecting coil 3, a magnetic field as $H_3$ shown in FIG. 27(B) is applied to the detecting core 2. At this time, the magnetic flux generated in the detecting core 2 changes (inverts) its direction as the time changes as shown in FIG. 27 (C), by the hysteresis of the detecting core 2 as shown in FIG. 27(A).

In this case, a magnetic flux generating time $T_1$ on the plus (+) side and a magnetic flux generating time $T_2$ on the minus (−) side are equal, and the difference $(T_1-T_2)$ is zero.

While, when the current I is flowing through the wire 1 being detected and the triangular wave-shaped current is applied to the detecting coil 3, a magnetic field as $H_4$ in FIG. 27(B) is applied to the detecting core 2. At this time, a magnetic flux generated in the detecting core 2 changes (inverts) its direction as the time change as shown in FIG. 27 (D), by the hysteresis of the detecting coil 2 as shown in FIG. 27(A).

In this case, the magnetic flux generating time $T_1$ on the plus (+) side is longer than the magnetic flux generating time $T_2$ on the minus (−) side, and the difference is plus $(T_1-T_2>0)$.

Figure 27C:
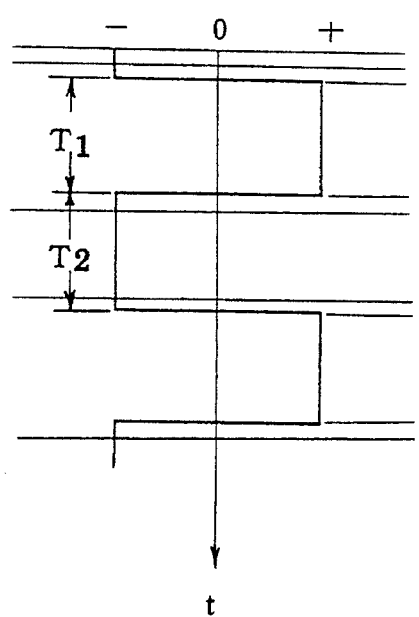
Figure 27D:
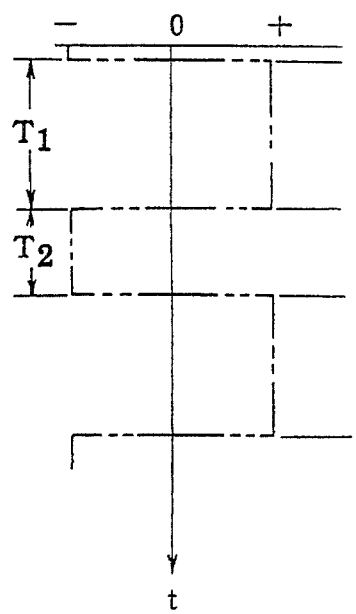

It can be understood by description of FIG. 24 and FIG. 26, that the electromotive force generated in the detecting coil 3 by the magnetic flux shown in FIGS. 27(C) and (D), and the output characteristics obtained by phase detection after passing the electromotive force through the limiter and restricting the wave height, shows the same output time characteristics as shown in FIG. 27 (C) and FIG. 27 (D).

Thus, by setting a maximum value of an electric current applied to the detecting coil 3 sufficiently to generate a magnetic field above a coercive force of the material of the detecting core 2, an influence of the hysteresis of the material of the detecting core 2 becomes constant (always drawing a same hysteresis loop), and since the difference $(T_1-T_2)$ is proportional to the current I flowing through the wire 1 being detected, it is understood that the output characteristics obtained finally becomes linear.

The operation and effects of the present invention described heretofore are same, not only in the DC current sensor having the configuration shown in FIG. 1, but also in the DC current sensor having the configuration shown in FIG. 10, and the DC current sensors shown in FIG. 10, FIG. 13, FIG. 14, FIG. 18, FIG. 19 and FIG. 20 having the basic configuration thereof.

Furthermore, in the present invention, the configuration which prevents the occurrence of inverse regions following a hysteresis phenomenon of the output voltage, at the time of detection at a level where a coercive force of the detecting core can not be ignored, such as the case of ultra-micro current region (less than about ±10 mA) which can not be responded by the configuration shown in FIG. 10, or the case where a magnetic path length is lengthened to extend a large through wire, by further improvement of the configuration to reduce the occurrence of the inverse region( a region where the output voltage reduces as the DC current increases), following the hysteresis phenomenon of the output voltage (electromotive force) in the detecting coil in a micro current region shown in FIG. 10, is proposed.

That is, the DC current sensor having the configuration to reduce the output characteristic hysteresis due to the core residual magnetic flux, by arranging a modulation coil extended through in a same direction as the wire being detected to overlap an alternating magnetic field generated in the modulation coil, is proposed.

Figure 28:
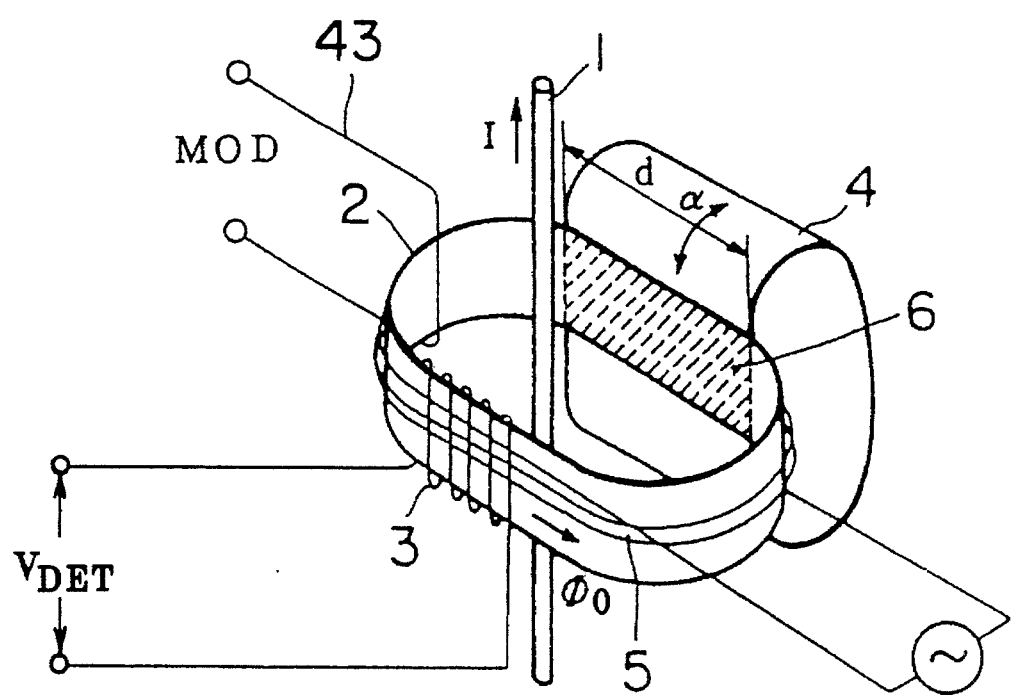
FIG. 28, FIG. 29 and FIG. 30 are explanatory perspective views showing the other embodiments of the DC current sensor of the present invention.

Particularly describing, in the configuration shown in FIG. 28, when providing a modulation coil 43 extended through in a same direction as the wire 1 being detected, and applying an AC current necessary to generate a magnetic field above $\propto$ Hc (coercive force), via the modulation coil 43, to the detecting core having a BH curve (hysteresis curve) as shown in FIG. 31 (B), as shown in FIG. 31 (C), a minor loop is formed and a center x of the loop coincides with an origin 0.

In the following, an outline of forming the minor loop is particularly described based on the figures.

In the above-mentioned phenomenon, as shown in FIG. 31 (C), for example, when DC current is applied to the wire 1 being detected, a modulation AC current is not applied to the modulation coil 43, and the DC current is cut after reaching a point P on a BH plane, it returns to a point A', (or the magnetic flux density in the core shows −Br).

In this state, when the above-mentioned modulation AC current is applied to the modulation coil 43, as an AC current wave form moves from A to B, it moves to any position between A →B and B₁ (usually, close to B' in the case of AC current) on the B-H curve. Thereafter, following the change of C→D→E, it moves to C'→D'→E' on the B-H loop, and follows the same route, or a minor loop Q indicated by dotted lines in the figure. A center of the minor loop Q coincides with an origin 0 of the BH curve.

While, as shown in FIG. 31 (D), when the modulation AC current is not applied to the modulation coil 43, and the DC current, which is applied to the wire 1 being detected in a direction opposite to the aforementioned direction, is cut after the core is excited to a point R, it returns to a point S (or the magnetic flux density in the core shows Br).

At this time, when AC currents ABCDE . . . are applied to the modulation col as same as aforementioned, the point S moves to B", and thereafter moves to any position between D' and D'1 (usually, close to D' in the case of AC current) via S", therefore follows the same route or a minor loop Q indicated by dotted lines in the figure. A center of the minor loop Q coincides with the origin 0 of the BH cure.

A phenomenon shown in FIGS. 31 (C), (D) is that, the center of the minor loop Q coincides with the origin 0 of the BH curve, regardless of a current value and a direction of the DC current applied to the wire 1 being detected before applying the modulation AC current.

Now, when the modulation AC current is applied to the modulation coil 43 to overlap the modulating Ac current on the current being detected in the state, where the DC current is flowing through the wire 1 being detected, a center x of the loop moves along a broken line shown in FIG. 31 (E) as substantially keeping a shape of minor loop Q, responsive to the current direction of the wire 1 being detected, thus by detecting this point the hysteresis has substantially disappeared.

Thus, in the configuration shown in FIG. 28, when providing the modulation coil 43 extended through in the same direction as the wire 1 being detected, and applying the AC current necessary to generate the magnetic field above the coercive force, the hysteresis characteristics generated by the residual magnetic flux caused by the coercive force of core materials can be eliminated, and by removing the overlap AC components in the detecting circuit, a detecting sensitivity in the ultra-micro current can be enhanced.

That is, the present invention is constituted such that, a core intersection which intersects and connects in circumferential direction of a detecting core is provided at a portion of the detecting core consisting of an annular soft magnetic material to dispose an exciting core consisting of an annular soft magnetic material in a body, a detecting coil is wound in a toroidal shape around the detecting core, and an exciting coil wound in a circumferential direction of the detecting core is wound around the detecting core, wherein a wire being detected through which a DC current for isolate detection is flowing is extended through the detecting core, a modulation coil more than one turn extended through in a same direction as the wire being detected is included, an alternating magnetic field generated in the modulating coil is overlapped onto the detecting coil, a wire being detected, through which a DC current for isolate detection is flowing, is extended through the detecting core, Ac current applying means which divides a frequency of an exciting current oscillated from an oscillator at a double frequency of the exciting current into half beforehand, and magnetically saturates the core intersection periodically by the exciting current, is connected to the exciting coil, thereby a magnetic flux generated in the detecting core in response to the AC current overlapped with the DC current flowing through the wire being detected at the time of excitation can be modulated, an electromotive force having a double frequency of the exciting current is outputted by the detecting coil, and further, the phase difference between the oscillator output and the detecting coil output is detected by phase comparison means, absolute values and the direction of the DC current flowing through the wire being detected and the overlap AC current are detected, and by removing the overlap AC current from the detecting signal, an output corresponding to the DC current flowing through the wire being detected can be detected at a high sensitivity.

Figure 29:
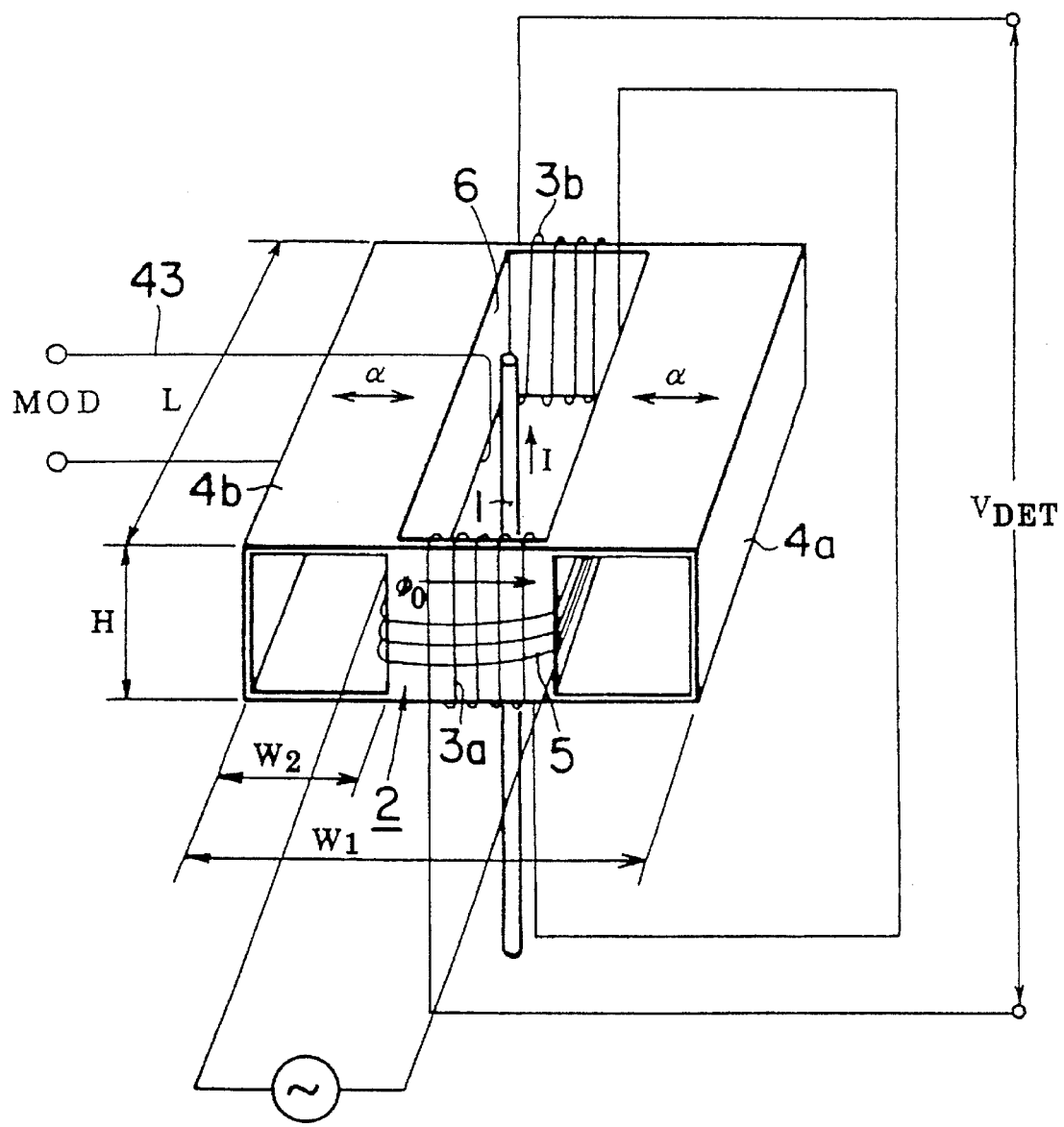
Figure 30:
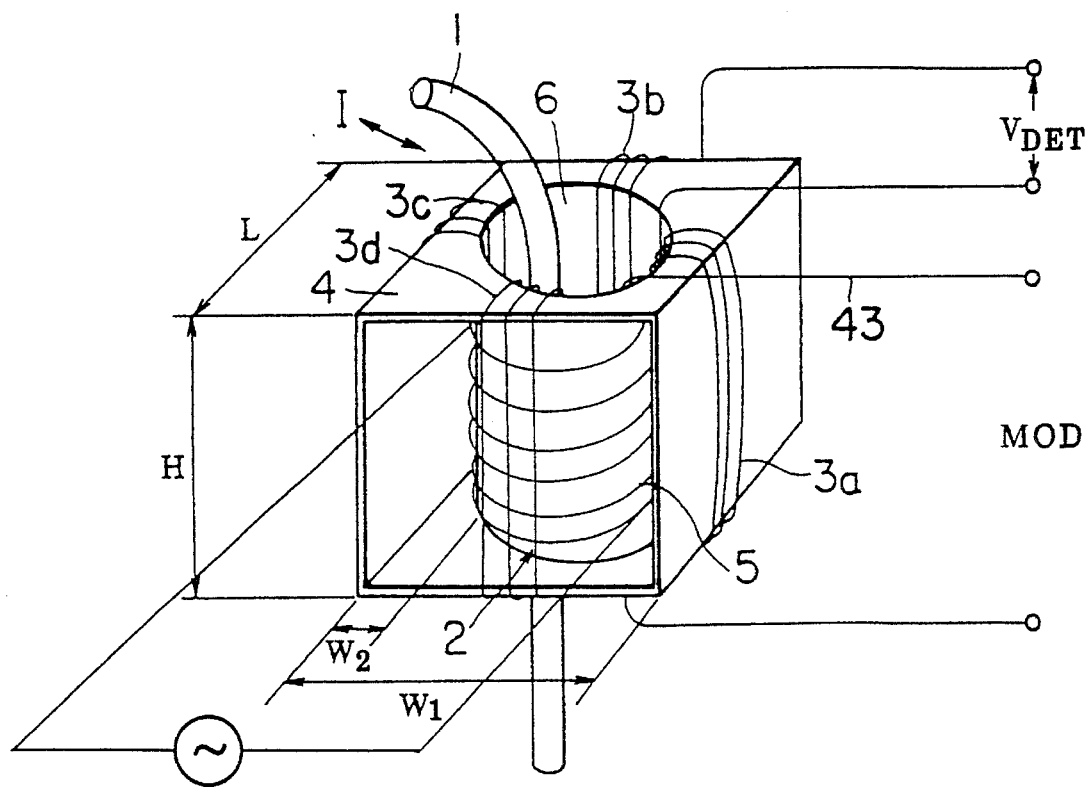
Figure 31A:
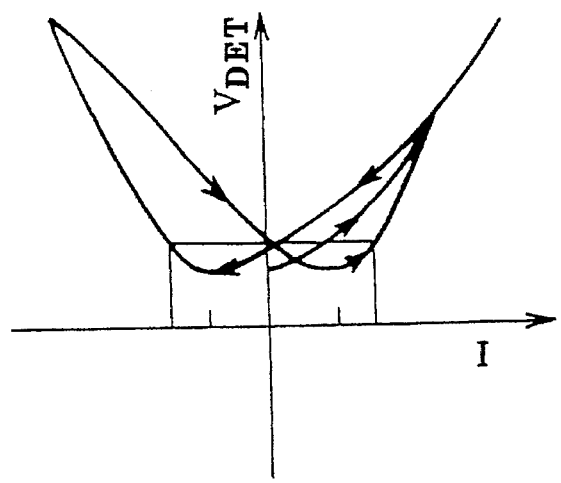
FIG. 31(A) is a linear graph showing the relationship between an electric current being detected and an output in an ultra-micro region in a DC current sensor of the present invention, 31(B) is a linear graph showing a BH curve (hysteresis curve) of a detecting core. 31(C) and 31(D) are linear graph showing a state, where a minor loop is formed by applying an AC current to a modulation coil, after applying the DC current to the wire being detected to excite the core, without applying the modulation AC current to the modulation coil, and cutting the DC current and 31(E) is a linear graph showing a moving state of a center of the minor loop, when the modulation AC current is applied to the modulation coil and the modulation AC current is overlapped on an electric current being detected, in a state where the DC current is flowing through the wire being detected.
Figure 31B:
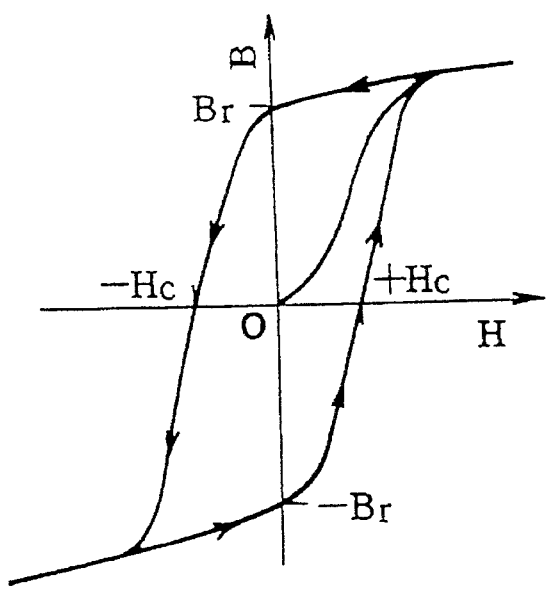
Figure 31C:
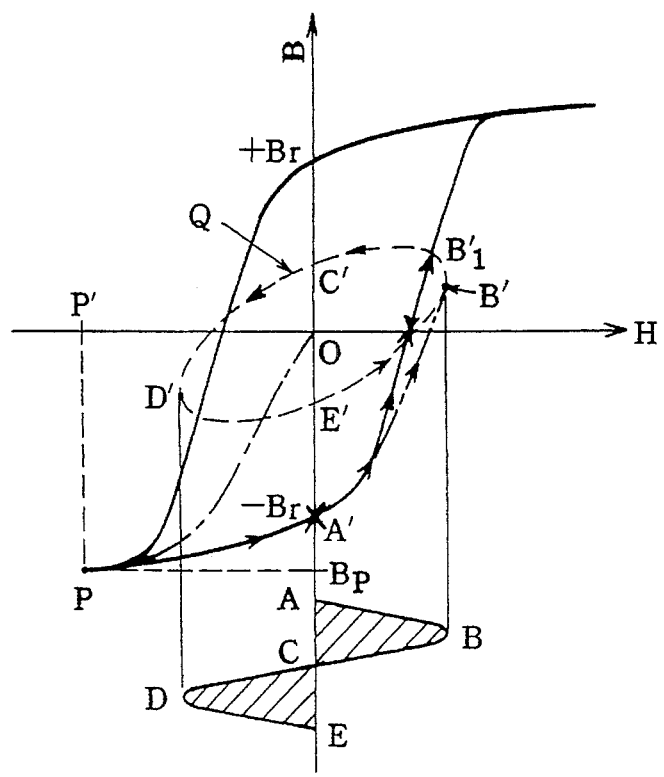
Figure 31D:
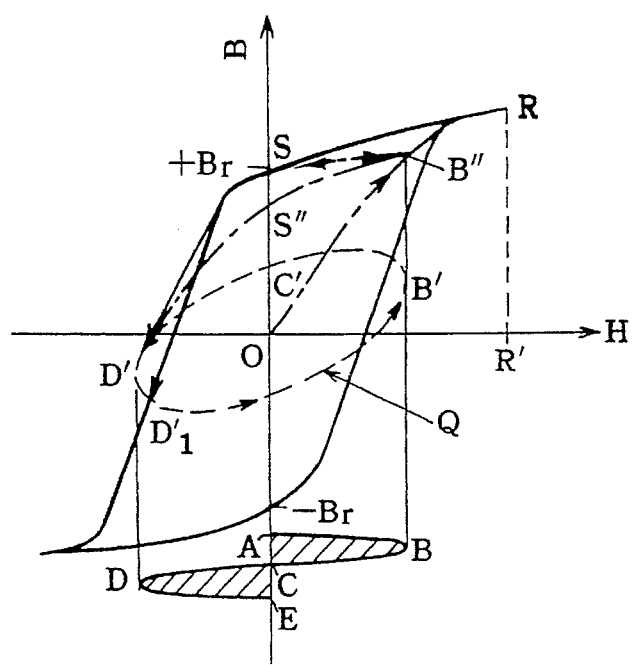
Figure 31E:
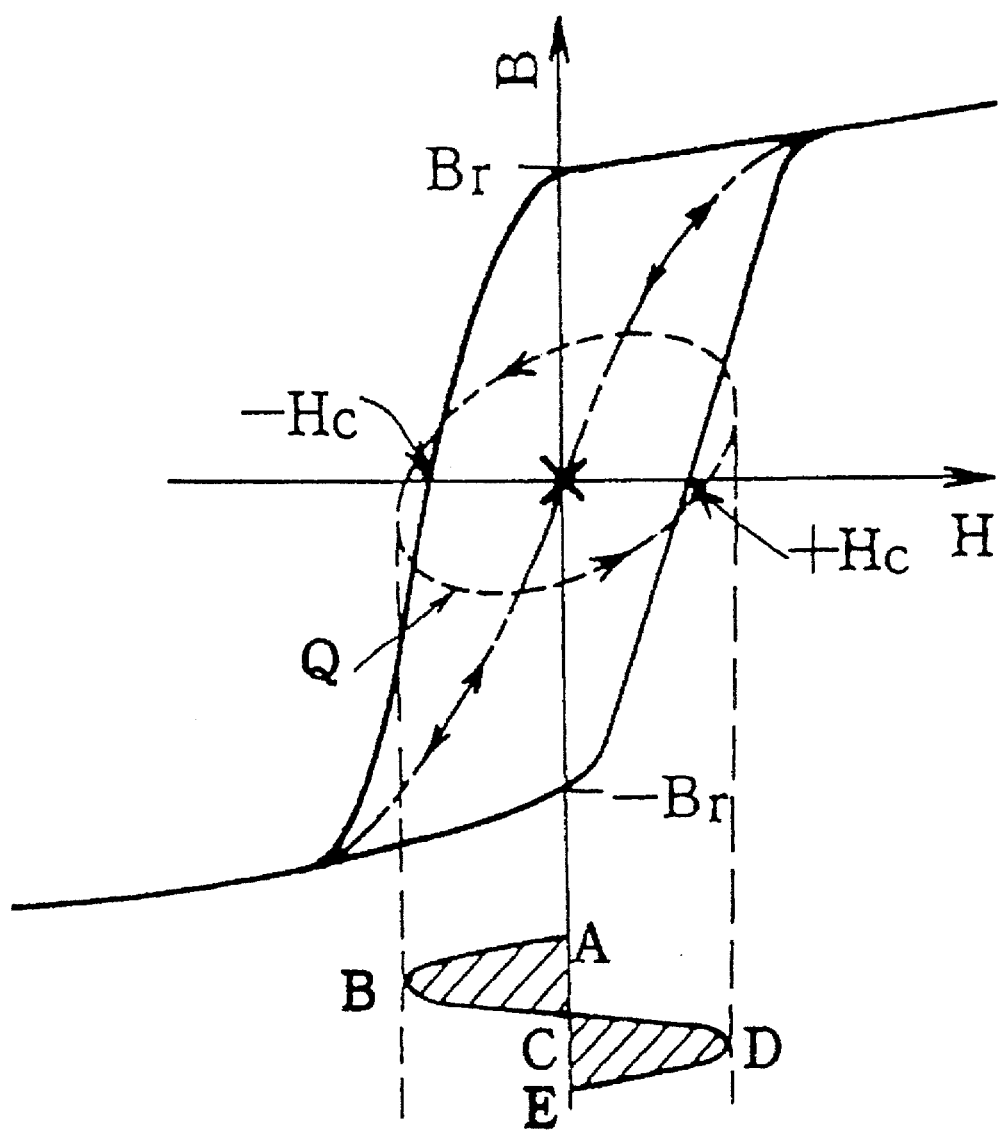

Similarly, also in the configuration, wherein the modulating coil 43 extended through in a same direction as the wire being detected is disposed, in the DC current sensor having the configuration of FIG. 18 as shown in FIG. 29, and in the configuration, wherein the modulating coil 43 extended through in a same direction as the wire being detected, in the DC current sensor having the configuration of FIG. 19 as shown in FIG. 30, the effect aimed at can be obtained.

The configuration, wherein various means described heretofore are adopted in combination, and whereby the effect of the invention can be realized most effectively, is described according to one embodiment shown in FIG. 30.

The configuration shown in FIG. 30 has the basic configuration described in FIG. 19, and further, consisting of a modulation coil. Hereupon, an exciting current in a state, where a frequency of the exciting current oscillated from an oscillator at a double frequency $2f_0$ of the exciting current is divided into half beforehand, is applied to the exciting col 5.

For example, the exciting coil 5 is connected to the Ac current applying means. The AC current applying means includes a OSC (oscillation circuit) which oscillates the exciting current having a double frequency $sf_0$ of the exciting current finally applied to the exciting coil 5, and a T-FF (trigger flip-flop) which divides the exciting current frequency into half, and connects an AC current whose frequency is once divided into $f_0$ from $2f_0$ to a LPF (low-pass filter) via a buffer amplifier.

The AC current necessary to generate a magnetic field above ±Hc of a core consisting of a soft magnetic material having the aforementioned configuration, is applied to the modulation coil 43, by the AC current applying means connected separately, to generate an alternating magnetic field, and thereby hysteresis characteristics generated by a residual magnetic flux caused by a coercive force of a core material is eliminated.

When the DC current I is applied to the wire 1 being detected in a predetermined direction, by the exciting current having the above-mentioned frequency $f_0$ divided into half and applied to the exciting coil 5, similar to the previously described electromotive force generating mechanism, the magnetic flux generated in the detecting core 2 is modulated, and the electromotive force consisting of a double frequency $2f_0$ of the exciting current proportional to a sum of the DC current I flowing through the wire 1 being detected and the AC current applied to the coil 43, can be outputted by the detecting coil 3, and by removing the AC component from the output generated in the detecting coil, an absolute value of the DC current I flowing through the wire 1 being detected can be known.

Phases of a voltage $V_{DET}$ having the frequency $2f_0$ generated in the detecting coil 3 differ by 180°, depending on the direction of the Dc current I flowing through the wire 1 being detected, as described in FIG. 2 and FIG. 3.

The output (electromotive force) having the frequency $sf_0$ generated in the detecting coil 3 in such a manner is inputted to a phase comparison circuit.

While, a portion of exciting current having the frequency $2f_0$ oscillated from the OSC constituting the AC current applying means, is inputted to the phase comparison circuit via the LPF (low-pass filter), phase shifter, Schmitt trigger and so on as keeping the frequency $2f_0$, without being connected to the exciting coil 5 via the T-FF and so on.

The phase comparison circuit detects the phase difference between the output from the oscillator inputted to the circuit and the output from the detecting coil 3, and outputs an output voltage $V_{OUT}$ of plus (+) or minus (−) which finally changes substantially linearly responsive to the direction of the DC current I flowing through the wire 1 being detected.

Since an output, in which the DC current I being measured and the AC current applied to the coil 43 are composed, is obtained in the detecting coil, this AC component must be removed. As methods for removing the AC component, those 1) using a band-pass filter having a high Q of passing frequency $2f_0$ removing overlap AC components from the obtained output by a low-pass filter after the phase detection, are effective.

That is, as it is understood from FIG. 2 and FIG. 3, when there is no phase difference between the output from the oscillator 11 and the output from the detecting coil 3, it is judged that the DC current I flowing through the wire 1 being detected is in a plus (+) direction (upward in FIG. 30), and when the phase difference is 180°, it is judged that the DC current I flowing through the wire 1 being detected is in a minus (−) direction (downward in FIG. 30), thus it is possible to output the absolute value of the DC current I together with the direction.

Particularly, in the DC current sensor of the present invention, since both the frequency of the exciting current oscillated from the oscillator connected to the exciting coil 5 and the frequency of the output $V_{DET}$ from the detecting coil 3 finally become a double frequency $2f_0$ of the exciting current applied to the exciting coil 5, the phase difference of the outputs consisting of the same frequency can be compared easily, and the direction of the DC current flowing through the wire being detected can be detected by a known phase comparison circuit having a relatively simple configuration.

The operation of the invention described heretofore is not only similar in the DC current sensor having the configuration shown in FIG. 30, but also in the DC current sensors having the configurations shown in FIG. 28 and FIG. 29, and further, in respective configurations, the effect making a good use of features previously described can be realized.

Figure 32:
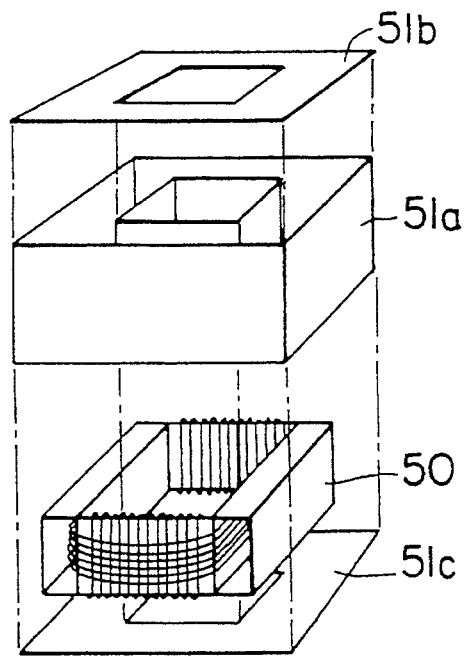
FIG. 32, FIG. 33, FIG. 34 and FIG. 35 are explanatory perspective views showing the other embodiments of a DC current sensor of the present invention.

When using these DC current sensors built into inverter equipments, particularly, in order to prevent switching noises, though it is effective to insert a noise filter into a power line of a detecting circuit, as shown in FIG. 32, it is desirable to cover the DC current sensor of the present invention consisting of various configurations, with a shield case (numeral 51a designates a case body, and numerals 51b, 51c designate case covers in the figure) consisting of parmalloy, non-oriented silicon steel plate and the like, to prevent the mixing of inductive noises.

Figure 33:
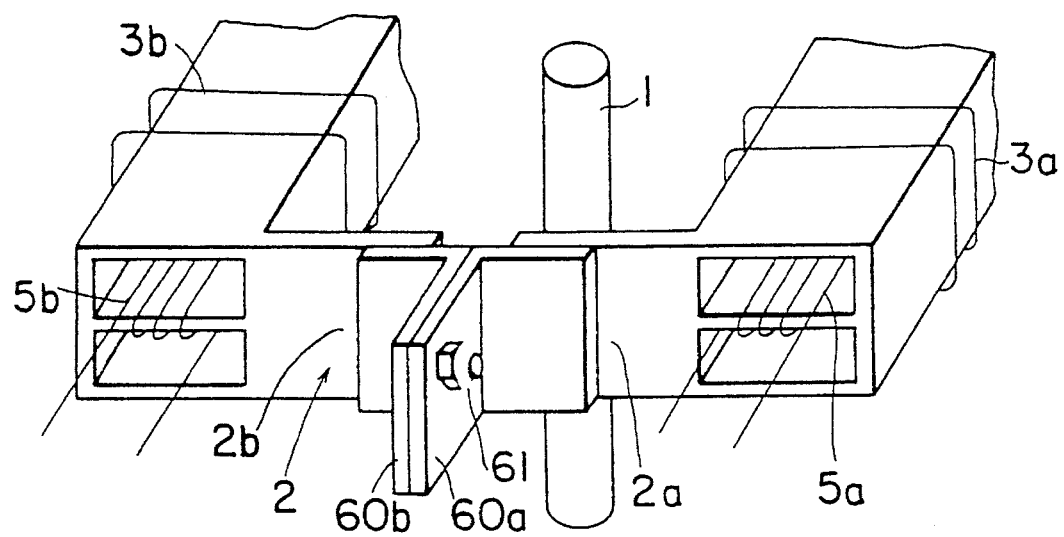
Figure 34:
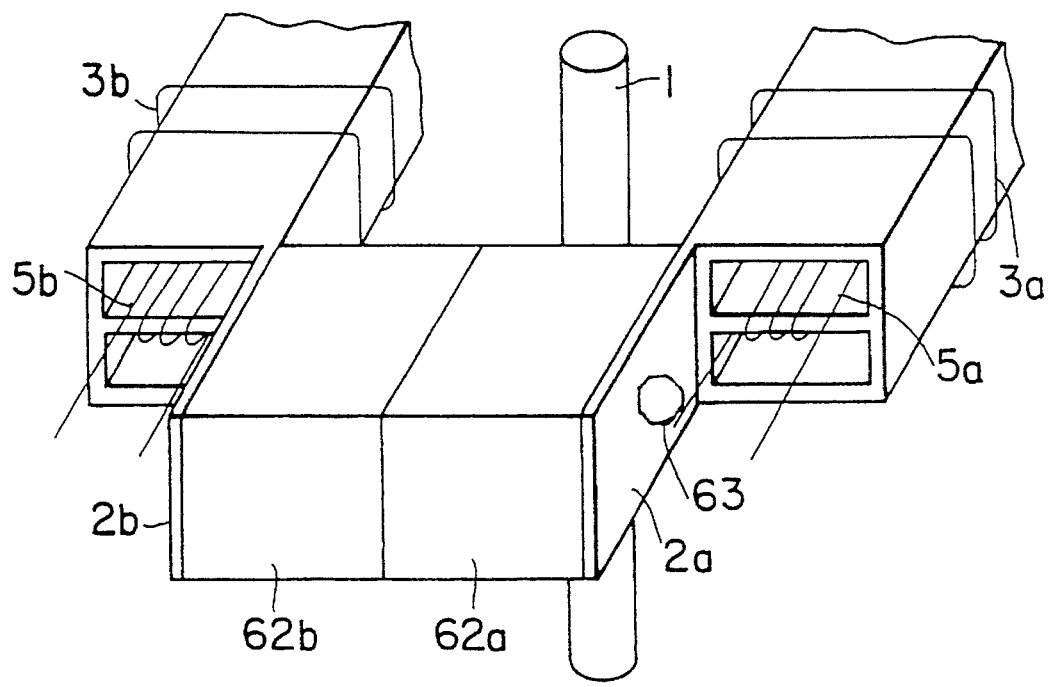
Figure 35:
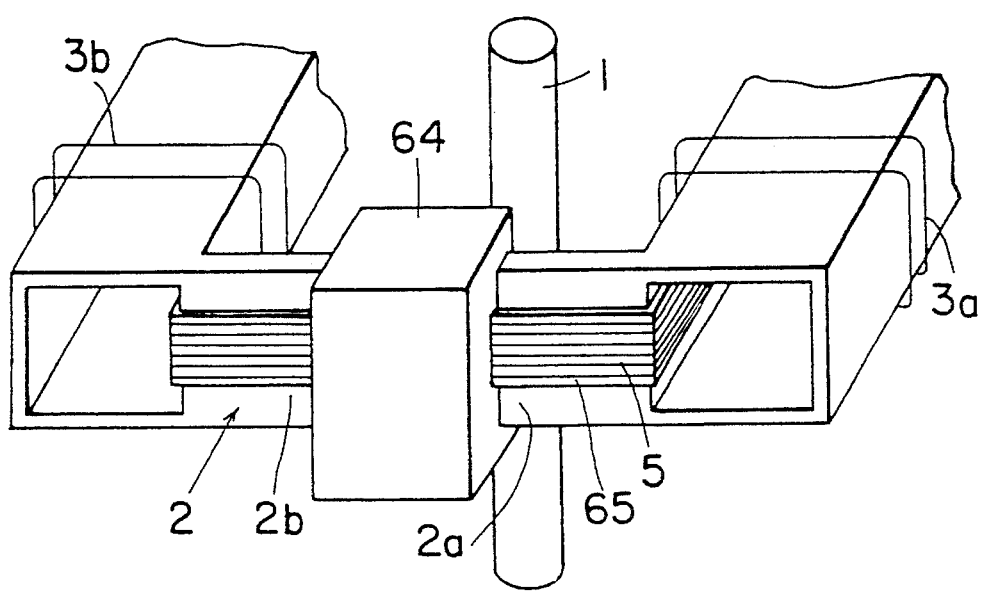

In order to install and arrange the DC current sensor of the present invention, without cutting a wire (the wire being detected) whose wiring is completed already, it is desirable to adopt the configurations as shown in FIG. 33, FIG. 34 and FIG. 35.

That is, the detecting core is divided beforehand, and a pair of detecting cores are integrated after disposing inside the wire being detected, thereby the original operation and effects of the DC current sensor of the present invention can be realized.

In the configuration shown in FIG. 33, the detecting core 2 of the DC current sensor having the configuration previously described according to FIG. 14 is divided. L-shaped mounting members 60a, 60b consisting of the same material as the detecting core 2 are secured to tip portions 2a, 2b of the divided detecting cores 2, and after arranging the wire 1 being detected at a predetermined position, integrated by a screw 61. Numerals 3a, 3b designate the detecting coils and numerals 5a, 5b designate the exciting coils.

In the configuration shown in FIG. 34, in place of the L-shaped mounting members 60a, 60b in the configuration shown in FIG. 33, block-shaped mounting members 62a, 62b consisting of the same material as the detecting core 2 are secured to the tip portions 2a, 2b of the divided detecting cores 2, and after arranging the wire 1 being detected at a predetermined position, integrated by a screw 63. According to this configuration, a connecting state of the mounting members 62a, 62b hardly changes by a clamping force of the screw 63, thus a stable output can be obtained.

In the configuration shown in FIG. 35, the tip portions 2a, 2b of the divided detecting cores 2 are connected electromagnetically in a socket 64. In the figure, numeral 5 designates an exciting coil which is disposed on a band-shaped resin flexible tape 65 beforehand, and after arranging the wire 1 being detected at a predetermined position and integrating the tip portions 2a, 2b of the detecting core 2 by the socket 64, arranged as winding around the detecting core 2, and its opposite end portions are finally connected electrically in the socket 64.

Though a configuration inside the socket 64 connecting the tip portions 2a, 2b of the detecting core 2 and the tip portion of the exciting coil 5 is not shown specifically, usually, known connecting means used in electric appliances can be adopted.

Though various configurations can be adopted responsive to the dividing and connecting means of the detecting core 2 besides the configurations shown in FIG. 33, FIG. 34 and FIG. 35, in any cases, in order to obtain the stable output characteristics, it is necessary to realize the stable electric connection at a connection of the above-mentioned detecting core 2.

That is, taking into account of an electromagnetic balance due to changes and shapes of the magnetic resistance, it is desirable to select the shape size and dividing and connecting means of the detecting core.

The DC current sensor of the present invention is not limited to the embodiments described above, and various configurations can be selected responsive to required characteristics and so on, as far as they are constituted to include means for forming a magnetic gap periodically at a portion of the detecting core, by the magnetic flux generated substantially perpendicularly against the magnetic flux generated in a circumferential direction of the detecting core by the DC current flowing through the wire being detected.

EMBODIMENT 1

A cross-shaped core material having a shape shown in FIG. 9 was obtained by punching from a thin plate of 0.2 mm thick consisting of parmalloy C (78%Ni-5%Mo-4%Cu-balFe). Where $L_1$=75 mm, $L_2$=50 mm, $W_1$=10 mm and $W_2$=13 mm Respective end portions of the core material were superposed on each other by 10 mm to form a body by stop welding, and assembled in a configuration shown in FIG. 1. Meanwhile, a DC current sensor of the present invention was obtained by completing heat treatment, whereby multi-stage cooling is conducted at 100° C./hr. between 600° C. to 400° C., after heat treatment of 1100° C.×3 hrs. in a hydrogen gas atmosphere.

A reduced diameter side (about 12.5 mm diameter) of a pair of annular cores serving as a detecting core 2, and a large diameter side (about 20 mm diameter) serving as an exciting core 4. After winding an insulting protective vinyl tape around the cores, a detecting coil 3 was prepared by winding 40 turns of formal wire of 0.2 mm outside diameter around the detecting core 2, and an exciting coil 5 was prepared by winding 20 turns of formal wire of 0.5 mm outside diameter around the exciting core 4. Furthermore, a wire 1 being detected consisting of a vinyl coating of 9.0 mm outside diameter was extended through the detecting core 2.

When an AC current of f=10 KHz, 500 mA was applied to the exciting coil 5 as an exciting current, through an output of $V_{DET}$=10 mV was detected in the detecting coil 3, believed to be effect of residual noises, when a DC current was not applied to the wire 1 being detected, when the DC current of 50 mA was applied to the wire 1 being detected, an output of $V_{DET}$=60 mV was detected in the detecting coil 3, thereby it has been confirmed that the DC current sensor of the present invention has a high practicability.

EMBODIMENT 2

Figure 36:
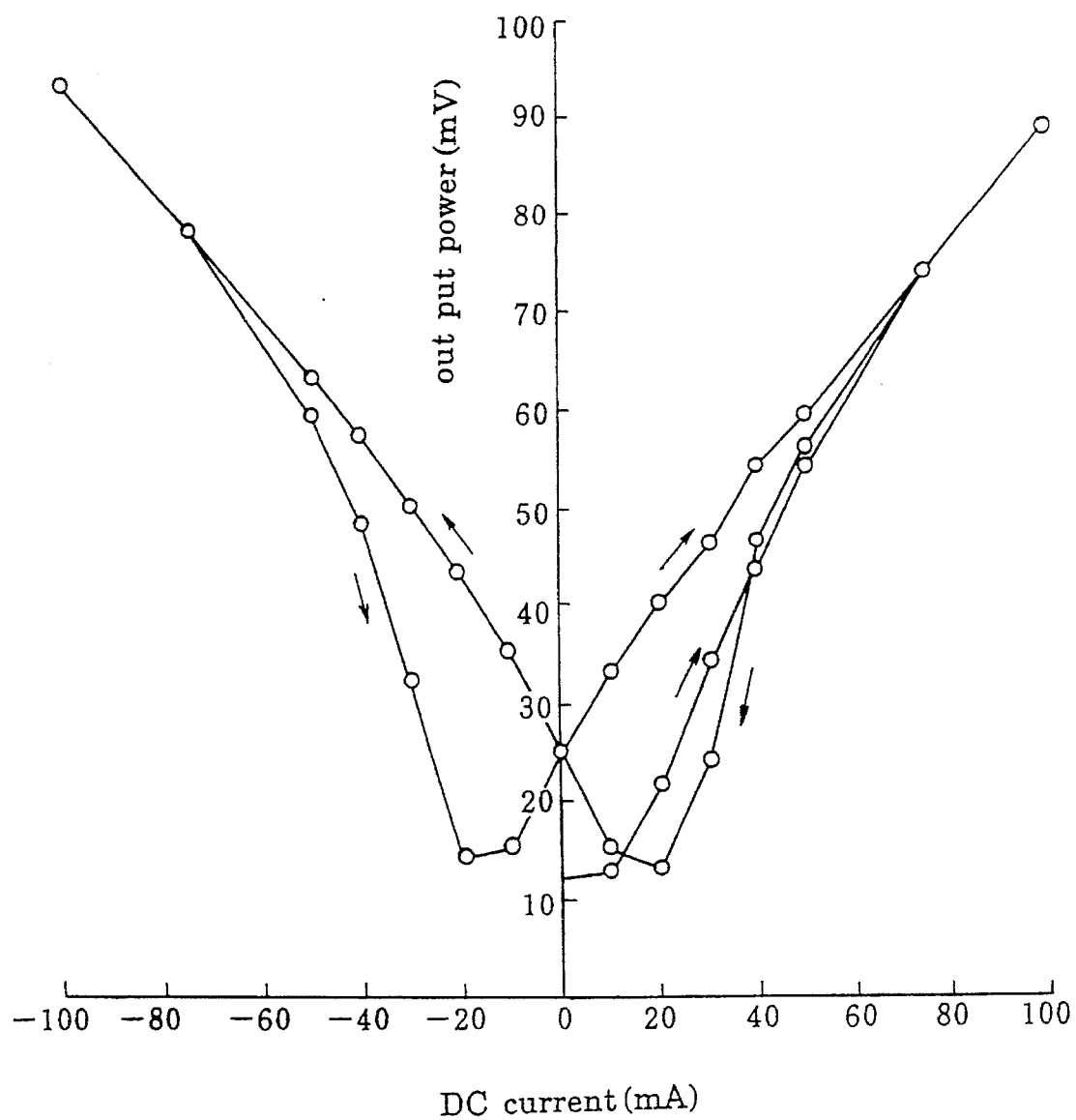
FIG. 36 is a linear graph showing the relationship between a DC current flowing through a wire 1 being detecting and an output in a DC current sensor of the present invention shown in FIG. 1.

Changes in an electromotive force (output) $V_{DET}$ outputted to the detecting coil when applying the DC current I, which is increased and decreased within a range of ∝ 100 mA, to the wire 1 being detected in the DC current sensor of embodiment 1, are shown in FIG. 36.

EMBODIMENT 3

In the DC current sensor of the embodiment 1, when it was constituted as shown in FIG. 5, wherein a width of the exciting core 4 is kept as it is (10 mm) at a connection with the detecting core 2, and the other portion is brought to 15 mm, even when the AC current of f=10 kHz, 300 mA was applied to the exciting coil 5 as the exciting current, about the same extent of output as the embodiment 1 was detected. That is, it has been confirmed that, the exciting current can be reduced by magnetically saturating only an intersection of the detecting core 2 and the exciting core 4, and leaving the other exciting core 4 portion unsaturated.

EMBODIMENT 4

A core assembly constituting a DC current sensor shown in FIG. 18 was obtained, by punching a thin plate of 0.1 mm thick consisting of paramalloy C (78% Ni- 5%No-4%Cu-balFE) into a shape shown in FIG. 12, bending along broken lines for assembling and spot welding at portions indicated by oblique lines. Where, L=25 mm, H=10 mm, $W_1$=30 mm and $W_2$=10 mm.

After heat treatment of 1100° C.×3 hrs. in a hydrogen gas atmosphere, heat treatment, whereby multi-stage cooling is conducted at 1100° C./hr. between 600° C. to 400° C., was completed on the assembly to obtain the DC current sensor of the present invention.

After winding an insulating protective vinyl tape around a required position of the detecting core 2, detecting coils 3a, 3b were prepared by winding 20 turns of formal wire of 0.2 mm outside diameter around the short sides of the detecting core 2, and further, an exciting coil 5 was prepared by winding 20 turns of formal wire of 0.5 mm outside diameter around the detecting core 2. A wire 1 being detected consisting of vinyl coating of 8 mm outside diameter was extended through the detecting core 2.

When an AC current of f 9 kHz, 300 mA was applied to the exciting coil 5 as an exciting current, through an output of $V_{DET}$=3 mV is detected in the detecting coil 3 (a total value of 3a and 3b in the figure), believed to be effect of residual noises, when the DC current was not applied to the wire 1 being detected, when the DC current I of 50 mA is applied to the wire 1 being detected, an output of $V_{DET}$=40 mV was detected in the detecting coil 3, thereby it has been confirmed that the DC current sensor of the present invention has a good practicability.

EMBODIMENT 5

Figure 37:
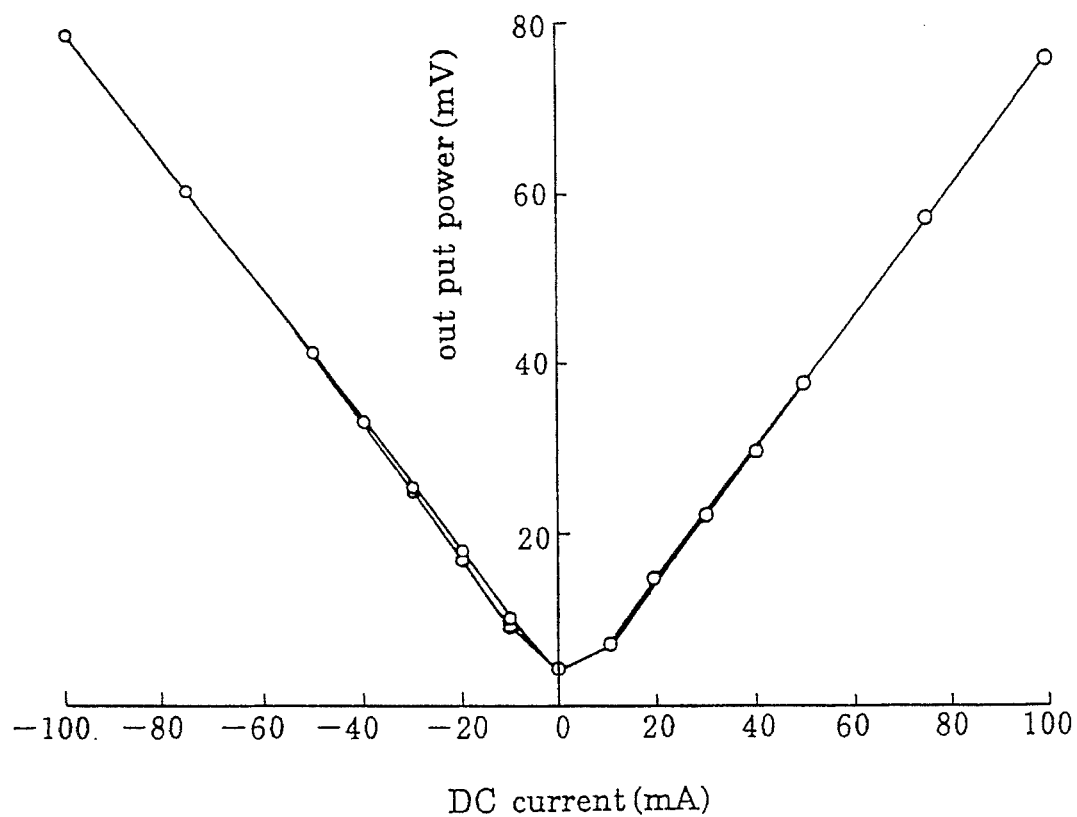
FIG. 37 is a linear graph showing the relationship between a DC current flowing through a wire 1 being detected and an output in a DC current sensor in the present invention.

Changes in an electromotive force (output) $V_{DET}$ outputted to the detecting coil 3 (a total value of 3a and 3b in the figure), when the DC current I applied to the wire 1 being detected was increased and decreased within a range of ± 100 mA, in the DC current sensor of the embodiment 4, are shown in FIG. 37. From FIG. 37, it has been confirmed that, even when the DC current flowing through the wire 1 being detected is a micro region, there is no output reducing phenomenon ("occurrence of inverse region") following the current increase, and a stable measurement can be realized.

Particularly, when comparing with the changes in the electromotive force (output) $V_{DET}$ shown in the embodiment 2, the effect is more apparent.

EMBODIMENT 6

Figure 38:
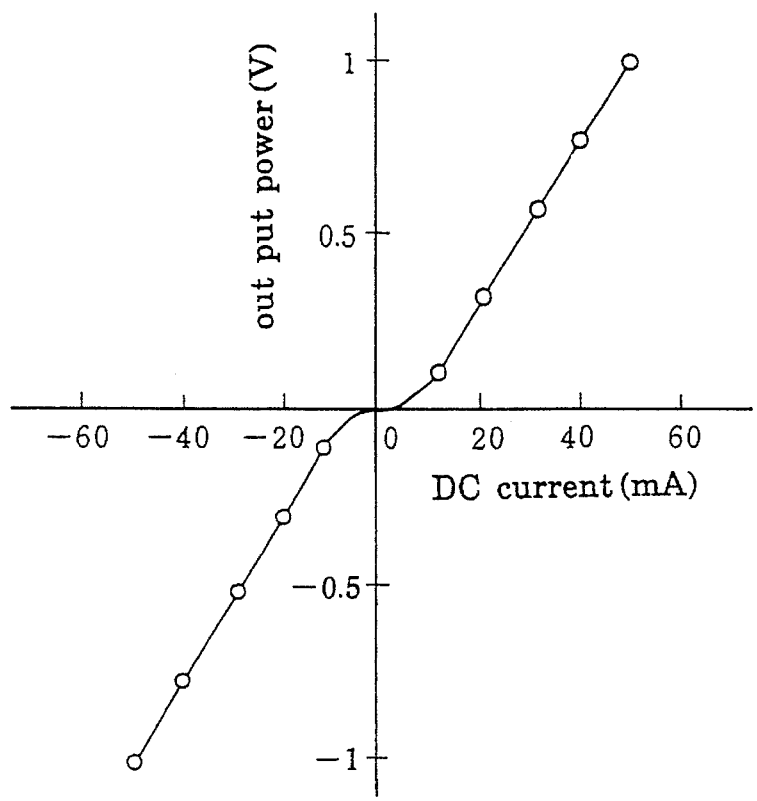
FIG. 38 is a linear graph showing the relationship between a DC current flowing through a wire 1 being detected, and an output, when an electric circuit shown in FIG. 22 is connected to a DC current sensor of the present invention shown in FIG. 18.

Changes in the electromotive force (output) $V_{OUT}$ of the detecting coil 3 (a total value of 3a and 3b in the figure) outputted via a phase comparison circuit, when a circuit shown in FIG. 22 is connected to the exciting coil 5 and detecting coil 3 in the DC current sensor of the embodiment 4, and an AC current of f=18 kHz, 300 mA is oscillated, as an exciting current, from an oscillator 11 oscillating the exciting current consisting of a double frequency of the exciting current applied finally to the exciting coil 5, and further, the DC current is applied to the wire 1 being detected by increasing and decreasing within range of ±50 mA, are shown in FIG. 38.

The output voltage $V_{OUT}$ is a value outputted via an amplifying circuit having a predetermined amplification effect.

From FIG. 38, according to the DC current sensor of the present invention, it is possible to detect the direction of the electromotive force (output) of the detecting coil 3 responding to the DC current flowing through the wire being detected, or it is possible to detect an absolute value as well as the direction of the DC current flowing through the wire being detected sensitively and stably.

Thus, since not only the absolute value but also the direction of the DC current flowing through the wire being detected can be detected, it can be used effectively in technical fields requiring controls of positive ⇆ negative operations and reciprocating operations depending on the direction of the DC current, for example, in an actuator using a DC motor.

EMBODIMENT 7

A core assembly constituting the DC current sensor shown in FIG. 30 was obtained, by punching a thin plate of 0.1 mm thick consisting of parmalloy (78%Ni-5%Mo-4%Cu-balFe) into a predetermined shape, bending a prede-termined location for assembling and spot welding thereof. Where, L=35 mm, H=15 mm, $W_1$=35 mm and $W_2$=10 min.

After heat treatment of 1100° Cm×3 hrs. in a hydrogen gas atmosphere, heat treatment, whereby multi-stage cooling is conducted at 100° C./hr. between 600° C. to 400° C., was completed on the assembly to obtain the DC current sensor.

After winding an insulating protective vinyl tape around a required position of the detecting core 2, detecting coils 3a, 3b, 3c and 3d were prepared by winding 20 turns of formal wire of 0.2 outside diameter around the detecting core 2, and further, an exciting coil 5 was prepared by winding 20 turns of formal wire of 0.5 outside diameter around the detecting core 2. A wire 1 being detected of 8 mm outside diameter consisting of a vinyl coating was extended through the cylindrical detecting core 2.

Furthermore, a modulation coil 43 was extended in a same direction as the wire 1 being detected extending through the cylindrical detecting core 2.

Output changes after removing, by the low-pass filter, AC components of 100 Hz in the electromotive force (output) $V_{OUT}$ of the detecting coil 3 (a total value of 3a, 3b, 3c and 3d in the figure) outputted via the phase comparison circuit, at the time of oscillating an AC current off =18 kHZ, 300 mA from the oscillator to the exciting coil 5 and the detecting coil 3 as the exciting current, applying a sine wave AC current of 100 Hz, 30 mA (at peak) to the modulation coil 43, and applying the DC current I to the wire 1 being detected as increasing and decreasing the DC current I within a range of ±50 mA, by disposing AC current applying means and the phase comparison circuit, wherein the oscillator oscillating the exciting current having a double frequency of the exciting current finally applied to the exciting coil is disposed.

The output voltage $V_{OUT}$ is a value outputted via an amplifying circuit having a predetermined amplification effect.

Figure 39:
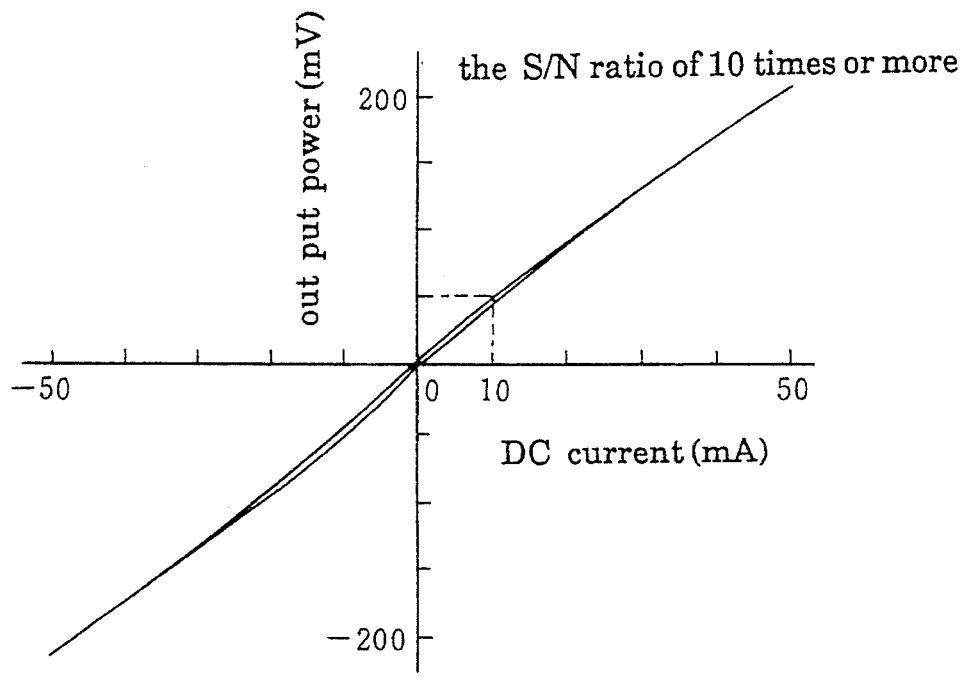
FIG. 39 is a linear graph showing the relationship between a DC current flowing through a wire 1 being detected, and an output in a DC current sensor of the present invention shown in FIG. 30.

From FIG. 39, according to the DC sensor of the present invention, it is possible to detect a direction of the electromotive force (output) of the detecting coil 3 responding to the DC current flowing through the wire being detected, that is, it is possible to detect the absolute value as well as the direction of the DC current flowing through the wire being detected sensitively and stably.

Also, as shown in FIG. 39, it is apparent that, a micro current of 10 mA can be detected at the S/N ratio of 10 times or more, there is no deterioration in a difference detection sensitivity due to the magnitude of reciprocating electric currents, and an error output due to the reciprocating electric currents is small.

Thus, also the DC current sensor of this embodiment, similar to that shown in the embodiment 6, since not only the absolute value but also the direction of the DC current flowing through the wire being detected can be detected, can be used effectively in technical fields requiring controls of positive E negative operations, or reciprocating operations depending on the direction of the DC current, for example, in an actuator using a DC motor, and further, more sensitive detection can be achieved and also the miniaturization is possible.

What is claimed is:
1. A DC current sensor, comprising
an exciting core of soft magnetic material and formed with a pair of tubular bodies, each tubular body being positioned in parallel with the other to provide therebetween a space, through which passes a wire conducting a current to be detected;

a detecting core formed with the side faces of a pair of tubular bodies and two plate-like members of soft magnetic material, each of which connecting integrally with each of the inside edges thereof near an opening of said tubular bodies to form a rectangular frame-shaped member as a whole;

exciting coils, each of which magnetically energizing the exciting core in the direction perpendicular to the plane of the detecting core;

detecting coils, each of which being wound around said detecting core; and means for applying an alternating current to the exciting coils to periodically and magnetically saturate the rectangular-shaped portions of said detecting core and exciting core, said means energizing said exciting coils to modulate a magnetic flux produced in the detecting core corresponding to the DC current flowing through said wire.

2. A DC current sensor according to claim 1, wherein the exciting coil is wound around the outside wall surface of the tubular body in the lengthwise direction thereof.

3. A DC current sensor according to claim 1, wherein each of said tubular bodies is provided inside thereof with a mid-shelf extending in the axial direction of the square tubular body, and the exciting coil is wound around said mid-shelf.

4. A DC current sensor according to claim 1, wherein the exciting coil is wound around the detecting core.

5. A DC current sensor according to claim 1, wherein the detecting coil is wound toroidally around each of the opposed side walls of the rectangular frame-shaped detecting core.

6. A DC current sensor according to claim 1, wherein the detecting core is composed of separable members.

* * * * *